United States Patent
Sato

(10) Patent No.: US 7,467,341 B2
(45) Date of Patent: Dec. 16, 2008

(54) BOUNDARY SCAN CONTROLLER, SEMICONDUCTOR APPARATUS, SEMICONDUCTOR-CIRCUIT-CHIP IDENTIFICATION METHOD FOR SEMICONDUCTOR APPARATUS, AND SEMICONDUCTOR-CIRCUIT-CHIP CONTROL METHOD FOR SEMICONDUCTOR APPARATUS

(75) Inventor: Tomotoshi Sato, Nabari (JP)

(73) Assignee: Sharp Kabushiki Kaisha, Osaka (JP)

( * ) Notice: Subject to any disclaimer, the term of this patent is extended or adjusted under 35 U.S.C. 154(b) by 516 days.

(21) Appl. No.: 10/545,511

(22) PCT Filed: Feb. 10, 2004

(86) PCT No.: PCT/JP2004/001430

§ 371 (c)(1),
(2), (4) Date: Aug. 12, 2005

(87) PCT Pub. No.: WO2004/072667

PCT Pub. Date: Aug. 26, 2004

(65) Prior Publication Data

US 2006/0220672 A1    Oct. 5, 2006

(30) Foreign Application Priority Data

Feb. 12, 2003    (JP)    ............................. 2003-033995

(51) Int. Cl.
*G01R 31/28*    (2006.01)
(52) U.S. Cl. .................................................. 714/727
(58) Field of Classification Search ............. 714/727
See application file for complete search history.

(56) References Cited

U.S. PATENT DOCUMENTS 4,701,921 A * 10/1987 Powell et al. ............... 714/727

(Continued)

FOREIGN PATENT DOCUMENTS

EP    1 099 953 A2    5/2001

(Continued)

OTHER PUBLICATIONS

International Preliminary Report on Patentability for PCT Application No. PCT/JP2004/001430 mailed on Feb. 13, 2006, six pages.

*Primary Examiner*—Cynthia Britt
*Assistant Examiner*—Steven D Radosevich
(74) *Attorney, Agent, or Firm*—Morrison & Foerster LLP

(57) ABSTRACT

An object of the invention is to provide a boundary scan controller that allows a boundary scan to be executed and also allows a semiconductor apparatus to be manufactured in such a manner that the same type of semiconductor circuit chips are stacked. When identification data stored in memory means (85) is compared with fixed data held in fixed-data holding means (87) by comparison means (88) and the identification data is coincident with the fixed data, a data derivation section (89) outputs the same data as data which is outputted from an output section (86). In a boundary scan test, a data derivation section (89) of a boundary controller (80) provided for each semiconductor circuit chip is connected to the same bus line. When the identification data is not coincident with the fixed data, the data derivation section (89) can be substantially disconnected from the bus line. In this way, the same type of semiconductor circuit chips for which the boundary controller (80) is provided can be stacked, thereby manufacturing the semiconductor apparatus.

9 Claims, 17 Drawing Sheets

U.S. PATENT DOCUMENTS

| | | | |
|---|---|---|---|
| 5,198,759 A * | 3/1993 | Ohnesorge | 714/727 |
| 5,423,050 A * | 6/1995 | Taylor et al. | 714/31 |
| 5,513,188 A * | 4/1996 | Parker et al. | 714/727 |
| 5,627,842 A * | 5/1997 | Brown et al. | 714/727 |
| 5,911,039 A * | 6/1999 | Hashizume et al. | 714/30 |
| 6,141,245 A | 10/2000 | Bertin et al. | |
| 6,243,283 B1 * | 6/2001 | Bertin et al. | 365/63 |
| 6,779,145 B1 * | 8/2004 | Edwards et al. | 714/733 |
| 6,988,232 B2 * | 1/2006 | Ricchetti et al. | 714/736 |
| 7,046,522 B2 * | 5/2006 | Sung et al. | 361/803 |
| 7,231,552 B2 * | 6/2007 | Parker et al. | 714/30 |
| 2003/0025191 A1 | 2/2003 | Takeoka et al. | |
| 2003/0172333 A1 * | 9/2003 | Wehage | 714/726 |

FOREIGN PATENT DOCUMENTS

| | | |
|---|---|---|
| JP | 61-155874 A | 7/1986 |
| JP | 2001-135786 A | 5/2001 |
| JP | 2003-014819 A | 1/2003 |

* cited by examiner

BOUNDARY SCAN CONTROLLER, SEMICONDUCTOR APPARATUS, SEMICONDUCTOR-CIRCUIT-CHIP IDENTIFICATION METHOD FOR SEMICONDUCTOR APPARATUS, AND SEMICONDUCTOR-CIRCUIT-CHIP CONTROL METHOD FOR SEMICONDUCTOR APPARATUS

CROSS-REFERENCE TO RELATED APPLICATIONS

This application is a National Phase filing under 35 U.S.C. § 371 of International Application No. PCT/JP2004/001430 filed on Feb. 10, 2004, which was amended under Article 19, on Jul. 28, 2004, and which claims priority to Japanese Patent Application No. 2003-033995filed on Feb. 12, 2003, the contents of each of which are incorporated herein by reference in their entirety.

TECHNICAL FIELD

The present invention relates to a boundary scan controller for testing connection states of input/output terminals of a plurality of semiconductor circuit chips which constitute a semiconductor apparatus, for example, three-dimensional multilayered LSIs (Large Scale Integration).

BACKGROUND ART

As a request for high-density packaging of the semiconductor circuit chips of a large scale integration (abbreviated to "LSI") has risen, it has been proposed to enhance a packaging density by stacking the semiconductor circuit chips in a vertical direction, namely, in the thickness direction of a circuit board.

There is a semiconductor apparatus wherein, in order to realize the high-density packaging, the semiconductor circuit chips stacked by tape carrier packages are respectively connected to a circuit board. In such a semiconductor apparatus, tape carriers include identification signal lines so as to be capable of identifying the individual chips. Hereinafter, the semiconductor circuit chips will be simply stated as "chips" in some cases.

FIG. 11 is a perspective view showing a semiconductor apparatus in which chips 2 are stacked using tape carriers 1, and the semiconductor apparatus in which the three chips 2 are stacked is shown in FIG. 11. Each of the chips 2 includes a first chip side terminal 3 to which a chip selection signal for selecting the operation of the individual chip 2 is input, and second terminals 4 to and from which other signals are input and output. Besides, a circuit board includes terminals 5a-5b on a first circuit board side for providing the chip selection signals to the respective chips 2 independently of one another, and terminals 6 on a second circuit board side for providing and accepting the other signals.

The tape carriers 1 include wiring lines 7 which connect the first and second chip side terminals 3, 4 and the first and second circuit board side terminals 5, 6, respectively. The tape carriers 1 are disposed separately from the chips 2, and are formed by being stacked similarly to the chips 1. In FIG. 11, the tape carriers 1 are parts indicated by oblique lines.

In such a semiconductor apparatus, the pattern of those parts 8 of the wiring lines 7 which are to be connected with the first circuit board side terminals 5 is redundantly created beforehand, and in mounting tape carrier packages, each of which consists of the tape carrier 1 and the chip 2, on the circuit board, the necessary wiring line parts are left behind, and the unnecessary wiring line parts are cut away. Thus, as shown in FIG. 11, the chip selection signals can be fed to the respective chips 2 independently of one another, and the stacked chips 2 are made identifiable using the chip selection signals.

As the operating speed and functions of the chips 2 have been heightened, there occurs the problem that, with the packages employing the tape carriers 1 as stated above, the performances of the chips 2 cannot be satisfactorily demonstrated on account of signal delays ascribable to the wiring lines.

In view of such a problem, it has been proposed in the first prior art that chips having electrodes each of which penetrates vertically through the corresponding chip are stacked into a module (refer to, for example, the specification of U.S. Pat. No. 6,141,245). For the chips to be stacked, the individual chips need to be identified as in the contrivance in the case of realizing the multilayered module of the tape carrier packages.

FIGS. 12-14 are views for explaining a semiconductor apparatus which is configured by stacking chips that have electrodes penetrating vertically through the chips. For the sake of description, only the penetrating leads depicted with hatched lines which penetrate through the chips, and wiring lines which extend between these penetrating leads depicted with hatched lines and the connection terminals 14-16 of the chips, are illustrated in FIGS. 12-14, and the chips, inter-layer insulating films, etc. are not illustrated. Besides, only the wiring lines relevant to chip selection signals are shown in FIGS. 12-14. Also, the case of stacking the three chips as in the semiconductor apparatus shown in FIG. 11 will be described here. The penetrating electrodes depicted with hatched lines penetrate through the chips in the stacked direction of these chips.

FIG. 12 is a perspective view showing a chip selection wiring line 17 which is a wiring line laid in the chip of lower stage when the chips have been stacked, and which transmits the chip selection signal for selecting the operation of this chip. FIG. 13 is a perspective view showing a chip selection wiring line 18 which is laid in the chip of middle stage. FIG. 14 is a perspective view showing a chip selection wiring line 19 laid in the chip of upper stage.

The lower-stage chip includes the chip side connection terminal 14 to which the chip selection signal is input, the penetrating electrodes 21, 22, 23 which penetrate through this chip and which serve to connect the chip side connection terminal 14 and any terminal disposed on a circuit board, a connection line 24 which serves to connect the chip side connection terminal 14 and the penetrating electrode 21 with each other, and connection terminals 25, 26 which connect the penetrating electrodes 22, 23 and the terminals of the stacked middle-stage chip. The penetrating electrodes 22, 23 are leads for transmitting the chip selection signals to the stacked middle-stage and upper-stage chips. In FIG. 12, the penetrating electrodes 21, 22, 23 are indicated by oblique lines, and the connection line 24 is indicated by meshed lines.

The middle-stage chip includes the chip side connection terminal 15 to which the chip selection signal is input, penetrating electrodes 27, 28 which penetrate through this chip and which are respectively connected with the penetrating electrodes 22, 23 disposed in the lower-stage chip, through the connection terminals 25, 26, a connection line 29 which serves to connect the chip side connection terminal 15 and the penetrating electrode 27 with each other, and a connection terminal 31 which connects the penetrating electrode 28 and the terminal of the stacked upper-stage chip. The penetrating electrode 28 is a lead for transmitting the chip selection signal to the stacked upper-stage chip. Unlike the lower-stage chip, the middle-stage chip suffices with a configuration in which only the two penetrating electrodes are disposed. That is, even when a penetrating electrode 32 indicated by phantom lines in FIG. 13 is made, it is not connected. In FIG. 13, the penetrating electrodes 27, 28 are indicated by oblique lines, and the connection line 29 is indicated by meshed lines.

The upper-stage chip includes the chip side connection terminal 16 to which the chip selection signal is input, a penetrating electrode 33 which penetrates through this chip and which is connected with the penetrating electrode 28 disposed in the lower-stage chip, through the connection terminal 31, and a connection line 34 which serves to connect the chip side connection terminal 16 and the penetrating electrode 33 with each other. Unlike the lower-stage and middle-stage chips, the upper-stage chip suffices with a configuration in which only one penetrating electrode is disposed. That is, even when penetrating electrodes 35, 36 indicated by phantom lines in FIG. 14 are made, they are not connected. In FIG. 14, the penetrating electrode 33 is indicated by oblique lines, and the connection line 34 is indicated by meshed lines.

The wiring patterns shown in FIGS. 12-14 need to be provided in the chips beforehand. That is, the chip to be stacked is fabricated as a chip separated from the underlying chip, in a wafer process for fabricating the particular chip.

In a case where different sorts of chips are to be stacked, the mere stacking of them poses no problem because they are chips originally separated from one another. However, in a case where the same chips are to be stacked in a large number, for example, where a large-capacity memory is to be realized by stacking memories in a large number, the same chips cannot be stacked, so that the different sorts of chips need to be fabricated in the number of chips to-be-stacked, and a surplus labor is required.

Besides, in a semiconductor apparatus for realizing high-density packaging, there are mounted circuits for electrically testing whether or not the packaged chips are connected, that is, boundary scan controllers.

The boundary scan controller includes five signal lines; TDI (Test Data input: data input part), TDO (Test Data Output: data output part), TCK (Test Clock input: clock input part), TMS (Test Mode Select input: test mode input part) and TRST (Test Reset input: test reset input part) on account of the standards of a boundary scan test. Herein, the signal line TRST is optional.

In a boundary scan which conforms to the standards of the JTAG (Joint European Test Action Group), the signal lines TDI and TDO of the boundary scan controllers incorporated in the individual chips in the semiconductor apparatus are connected in the shape of a chain. Hereinafter, the chain-like connection of the boundary scan controllers will be sometimes stated as "daisy chain". The signal lines TCK, TMS, TDI and TRST shall be generally termed "input section".

Next, the technique of the boundary scan test will be described.

FIG. 15 is a circuit diagram showing the connection states of a plurality of chip assemblies IC which include boundary scan controllers, while FIG. 16 is a diagram showing a multilayered module 50 which is configured by stacking the chip assemblies IC in the circuit diagram of FIG. 15. The multilayered module 50 is configured in such a way that the plurality of chip assemblies IC1, IC2, . . . , ICn (where n denotes an integer of at least 3) are stacked. Hereinafter, the chip assemblies IC1-ICn shall be stated as "chips IC" when generally termed. A connector 52 is connected to the multilayered module 50, and a JTAG tester is connected to the connector 52. In FIG. 16, the chip assemblies IC shown are stacked at the lowermost stage, middle stage and uppermost stage in succession from the left.

The signal lines TCK, TMS or TRST in the respective chip assemblies IC are connected to the corresponding pin of the connector 52 in parallel with one another through wiring patterns provided in these chip assemblies IC. On the other hand, regarding the signal lines TDI and TDO, the signal lines TDO of the chip assemblies IC on the preceding stage side are successively connected in cascade to the signal lines TDI of the chip assemblies IC on the succeeding stage side. Besides, the signal line TDI of the chip assembly IC1 of the first stage and the signal line TDO of the chip assembly ICn of the uppermost stage are connected to the respectively corresponding pins of the connector 52.

In the multilayered module 50 thus configured, the chip assemblies IC are controlled by the JTAG tester, whereby the boundary scan test is performed simultaneously for all the chip assemblies IC.

In the multilayered module 50, only the chip assembly ICn to be stacked at the uppermost stage needs to have connections different from those of the chip assemblies except this chip assembly ICn. Therefore, only the chip assembly ICn at the uppermost stage needs to be fabricated separately from the other chips by a wafer process.

FIGS. 17 and 18 are perspective views showing the wiring patterns of the chip assemblies in the multilayered module 50 shown in FIG. 16, and the case of stacking the chip assemblies by face-up is supposed in FIGS. 17 and 18. The "face-up" is a mounting method in which the chips are stacked with their circuit surfaces facing opposite to a circuit board. For the sake of description, only the penetrating electrodes depicted with hatched lines which are disposed in the chip assemblies, and wiring lines which extend between these penetrating electrodes depicted with hatched lines and the connection terminals 63 to 68 of the chips, are illustrated in FIGS. 17 and 18, and the chips, inter-layer insulating films, etc. are not illustrated.

FIG. 17 is the perspective view showing the wiring pattern of the chip assembly at each of the lowermost stage and the middle stage. The chip assembly at each of the lowermost stage and the middle stage includes the chip side connection terminal 63 of the TDI, the chip side connection terminal 64 of the TDO, the chip side connection terminal 65 for the bus connections of the TCK etc., the penetrating electrode 71 for transmitting the TDI signal, the connection line 72 for connecting the penetrating electrode 71 and the chip side connection terminal 63 of the TDI, a connection terminal 73 for transmitting a TDO signal to the chip of the upper stage, a connection line 74 on the chip for joining the chip side connection terminal 64 of the TDO and the connection terminal 73, the penetrating electrode 75 for the bus connections of the TCK etc., the connection line 76 on the chip for connecting the penetrating electrode 75 and the chip side connection terminal 65 for the bus connections of the TCK etc., a connection terminal 77 for transmitting the signals of the TCK etc. to the chip of the upper stage, and the penetrating electrode 78 for returning a TDO signal from the chip of the uppermost stage, to the lower stage.

FIG. 18 is the perspective view showing the wiring pattern of the chip assembly at the uppermost stage. The chip assembly of the uppermost stage includes the chip side connection terminal 63 of the TDI, the chip side connection terminal 64 of the TDO, the chip side connection terminal 65 for the bus connections of the TCK etc., the penetrating electrode 71 for transmitting a TDI signal, the connection line 72 for connecting the penetrating electrode 71 and the chip side connection terminal 63 of the TDI, the penetrating electrode 75 for the bus connections of the TCK etc., the connection line 76 on the chip for connecting the penetrating electrode 75 and the chip side connection terminal 65 for the bus connections of the TCK etc., the penetrating electrode 78 for returning the TDO signal from the chip of the uppermost stage, to the lower stage, and the connection line 79 for connecting the chip side connection terminal 64 of the TDO and the penetrating electrode 78.

The wiring pattern in the chip assembly at each of the lowermost stage and the middle stage and the wiring pattern in the chip assembly at the uppermost stage as respectively shown in FIGS. 17 and 18 need to be provided in the corresponding chip assemblies beforehand. That is, the chip assemblies to be stacked are fabricated as the separate chip assemblies in wafer processes. In the case of performing the boundary scans, it is only the chip assembly of the uppermost stage that needs to be made the separate chip assembly, as elucidated in FIGS. 17 and 18, but in a case where the same chips are to be stacked in a large number, for example, where a large-capacity memory is to be realized by stacking memories in a large number, there is the problem that the same chips cannot be stacked.

DISCLOSURE OF THE INVENTION

An object of the present invention is to provide a boundary scan controller which can perform a boundary scan and which permits a semiconductor apparatus to be configured by stacking semiconductor circuit chips of the same sort.

The invention is a boundary scan controller which is disposed in a semiconductor circuit chip, for controlling a shift register circuit composed of boundary scan cells respectively disposed between external signal input terminals and input terminals of an internal logic circuit and between external signal output terminals and output terminals of the internal logic circuit which are connected in series, comprising:

an input section for inputting a predetermined operation instruction, and identification data and test data of the semiconductor chip;

storage means for storing the identification data therein;

a clock input part for providing input/output timings;

a test mode input part for providing the predetermined operation instruction;

a data input part for inputting the identification data and test data of the semiconductor circuit chip;

control means for executing the predetermined operation instruction so as to store the identification data in the storage means, and for performing a circuit test with the test data so as to obtain test result data;

a data output section for outputting the test result data obtained by the control means;

fixed-data holding means for holding predetermined fixed data therein;

comparison means for making a comparison as to whether or not the identification data and the fixed data are in agreement, and outputting comparison result information; and a data derivation section for deriving data corresponding to the test result data which is outputted from the output section, on the basis of the comparison result information from the comparison means.

In accordance with the invention, when the operation instruction has been provided from the test mode input part beforehand, the control means executes the predetermined operation instruction. By executing the predetermined operation instruction, the control means stores the identification data of the semiconductor circuit chip input from the data input part, in the storage means, and performs the circuit test employing the test data received from the data input part, thereby to obtain the test result data. The circuit test employing the test data is, for example, the connection test of the semiconductor circuit chip which is performed by controlling the shift register circuit.

The comparison means makes the comparison as to whether or not the fixed data held in the fixed-data holding means and the identification data stored in the storage means are in agreement, and in the case of the agreement, outputs the comparison result information indicative of the agreement, whereas in the case of disagreement, outputs the comparison result information indicative of the disagreement. In the case of the agreement between the identification data and the fixed data as based on the comparison result information, the data derivation section outputs the data in the case of the agreement which corresponds to the test result data, and in the case of the disagreement between the identification data and the fixed data, the data derivation section outputs the data in the case of the disagreement which corresponds to the test result data. Accordingly, the data to be output from the data derivation section can be made different between in the case of the agreement between the fixed data and the identification data, and in the case of the disagreement.

The boundary scan test is performed in order to detect the connection states of individual semiconductor circuit chip assemblies in a semiconductor apparatus which is composed of a stack of semiconductor circuit chip assemblies which are configured by disposing the boundary scan controller in the semiconductor circuit chip. This boundary scan test is performed for a daisy chain in which a plurality of such boundary scan controllers are connected. In the daisy chain, the data output section of the boundary scan controller at a lower stage is connected to the data input section of the boundary scan controller at an upper stage. Besides, the test result data is derived from the data output section of the boundary scan controller disposed in the semiconductor circuit chip at the uppermost stage. In the boundary scan test, the inputs of the operation instruction, identification data and test data from each input section to the boundary scan controller, and the output data are detected by a JTAG tester.

With the boundary scan controllers of the invention, the identification data of the semiconductor circuit chip at the uppermost stage is held as the fixed data in the fixed-data holding means, whereby the data which is output from the data derivation section, in only the boundary scan controller at the uppermost stage, can be made different from the data which are output from the other data derivation sections. Accordingly, the data output sections of the boundary scan controllers disposed in the semiconductor circuit chips except at the uppermost stage are brought into non-connected states, whereby the data derivation sections of the individual boundary scan controllers can be connected to an identical bus line. That is, among the data derivation sections connected to the identical bus line, states which are output from the data derivation sections of the boundary scan controllers disposed in the semiconductor circuit chips except at the uppermost stage can be brought into, for example, a state which is pulled up or pulled down by a high impedance, or a floating state, whereby the data derivation sections can be, in effect, disconnected from the bus line.

Accordingly, the semiconductor apparatus can be configured by stacking the same semiconductor circuit chip assemblies which include the boundary scan controllers.

Besides, the invention is characterized in that, in a case where the identification data is stored in the storage means and where the comparison information outputted from the comparison means indicates the agreement between the identification data and the fixed data, the data derivation section outputs the same data as the test result data which is outputted from the data output section.

In accordance with the invention, in the case where the identification data is stored in the storage means and where the comparison information indicates the agreement between the identification data and the fixed data, the data derivation section outputs the same data as the test result data which is outputted from the data output section. Accordingly, the same data as the test result data is output from the data derivation section, so that detailed test result data can be obtained, and a detailed place of defective connection can be specified.

Besides, the invention is characterized in that, in a case where the identification data is not stored in the storage means, the data which is output from the data derivation section is brought into a state which the other boundary scan controllers cannot recognize, whereby the boundary scan controllers connected to the data derivation section are, in effect, nullified.

Alternatively, the invention is characterized in that the output of the data derivation section is maintained at a predetermined signal level. The "predetermined signal level" signifies, for example, a state of H level or a state pulled up to the H level by a high impedance.

In accordance with the invention, in this way, even when the other boundary scan controllers are connected to the output side of the data derivation section, the succeeding boundary scan controllers, in effect, do not operate. Even in a case where the semiconductor circuit connected to the boundary scan controller is defective, this boundary scan controller does not operate, and hence, input/output circuits fall into a disconnected state. By way of example, even when the defective semiconductor circuit chip is about to fall into an abnormal input/output pin state, no output is delivered, and any drawback can be avoided.

In accordance with the invention, the identification data which disagrees with the fixed data is provided in a case where the particular chip is arranged at any other stage than the uppermost stage of the stacking. In a case where the identification data is stored in the storage means and where the comparison information which is outputted from the comparison means indicates the disagreement between the identification data and the fixed data, the data derivation section can be brought into a state which is, in effect, disconnected from the circuit.

Besides, the invention is characterized in that, in a case where the identification data is stored in the storage means and where the comparison information which is outputted from the comparison means indicates the agreement between the identification data and the fixed data, the data derivation section outputs the same data as the data of the data output section.

In accordance with the invention, the identification data which agrees with the fixed data is provided in a case where the particular chip is arranged at the uppermost stage of the stacking. In the case where the identification data is stored in the storage means and where the comparison information which is output from the comparison means indicates the agreement between the identification data and the fixed data, the data derivation section outputs the same data as the data of the data output section.

Owing to the changeover of the output data, the boundary scan controllers connected behind the particular chip can be effectively operated.

Besides, the invention is characterized in that, in the case where the identification data is stored in the storage means and where the comparison information which is outputted from the comparison means indicates the disagreement between the identification data and the fixed data, the data derivation section is brought into, for example, a state pulled up or pulled down by a high impedance or a floating state.

In accordance with the invention, the identification data which disagrees with the fixed data is provided in a case where the particular chip is arranged at any other stage than the uppermost stage of the stacking. In the case where the identification data is stored in the storage means and where the comparison information which is outputted from the comparison means indicates the disagreement between the identification data and the fixed data, the data derivation section is brought into, for example, a state pulled up or pulled down by a high impedance, or a floating state, whereby the data derivation section is, in effect, disconnected from the bus line.

Besides, the invention is a semiconductor apparatus comprising a stack of semiconductor circuit chip assemblies which are each configured by disposing the boundary scan controller in a semiconductor circuit chip.

In accordance with the invention, the semiconductor circuit chip assemblies can be formed by the same wafer process, so that labor for forming the semiconductor circuit chip assemblies is relieved. Besides, in the case of forming the semiconductor apparatus, the same semiconductor circuit chip assemblies are stacked, so that a stacking order, etc. need not be considered, and the formation of the apparatus is facilitated.

Besides, the invention is characterized in that the semiconductor circuit chip is a memory chip, and
that a memory chip assembly includes:
additional address lines which are formed in addition to address lines of the memory chip;
a selection signal line for inputting a selection signal for selecting the memory chip; and
permission means for permitting an operation of the memory chip in a case where data corresponding to the additional address lines of the memory chip and the identification data stored in the storage means are in agreement, and where the selection signal is input.

In accordance with the invention, even when the selection signal for selecting the memory chip has been input, the operation of the memory chip is not permitted by the permission means unless data corresponding to the additional address lines agrees with the identification data stored in the storage means. Accordingly, even when the same selection signals have been input, the permission means can permit only the operation of one memory chip. Thus, each of stacked memory chips can be operated.

Besides, the invention is characterized in that the semiconductor circuit chip is a memory chip, and
that a memory chip assembly includes:
additional data lines which are formed in addition to data lines of the memory chip, and which are larger in number than the data lines; and
selection means for selecting the additional data lines and connecting them to the data lines of the memory chip, in accordance with the identification data stored in the storage means.

Besides, in accordance with the invention, the selection means selects the additional data lines in accordance with the identification data stored in the storage means and connects them to the data lines of the memory chip, so that the data lines can be allocated to each of stacked memory chips. Accordingly, each memory chip can be operated by connecting it to bus lines which are larger in number than bus lines corresponding to one memory chip.

Besides, the invention is a semiconductor-circuit-chip identification method in the semiconductor apparatus, characterized in that the respective semiconductor circuit chips are identified by the identification data stored in the storage means.

In accordance with the invention, the respective semiconductor circuit chips can be individually recognized by the identification data stored in the storage means. Accordingly, the semiconductor circuit chips can be individually managed by employing the identification data.

Besides, the invention is a semiconductor-circuit-chip control method in the semiconductor apparatus, characterized in that the semiconductor circuit chips which have been selected on the basis of the identification data stored in the storage means are operated.

In accordance with the invention, the semiconductor circuit chips which have been selected on the basis of the identification data stored in the storage means are operated, so that the stacked semiconductor circuit chips can be individually operated.

BRIEF DESCRIPTION OF DRAWINGS

Other and further objects, features, and advantages of the invention will be more explicit from the following detailed description taken with reference to the drawings wherein.

BEST MODE FOR CARRYING OUT THE INVENTION

Figure 1:
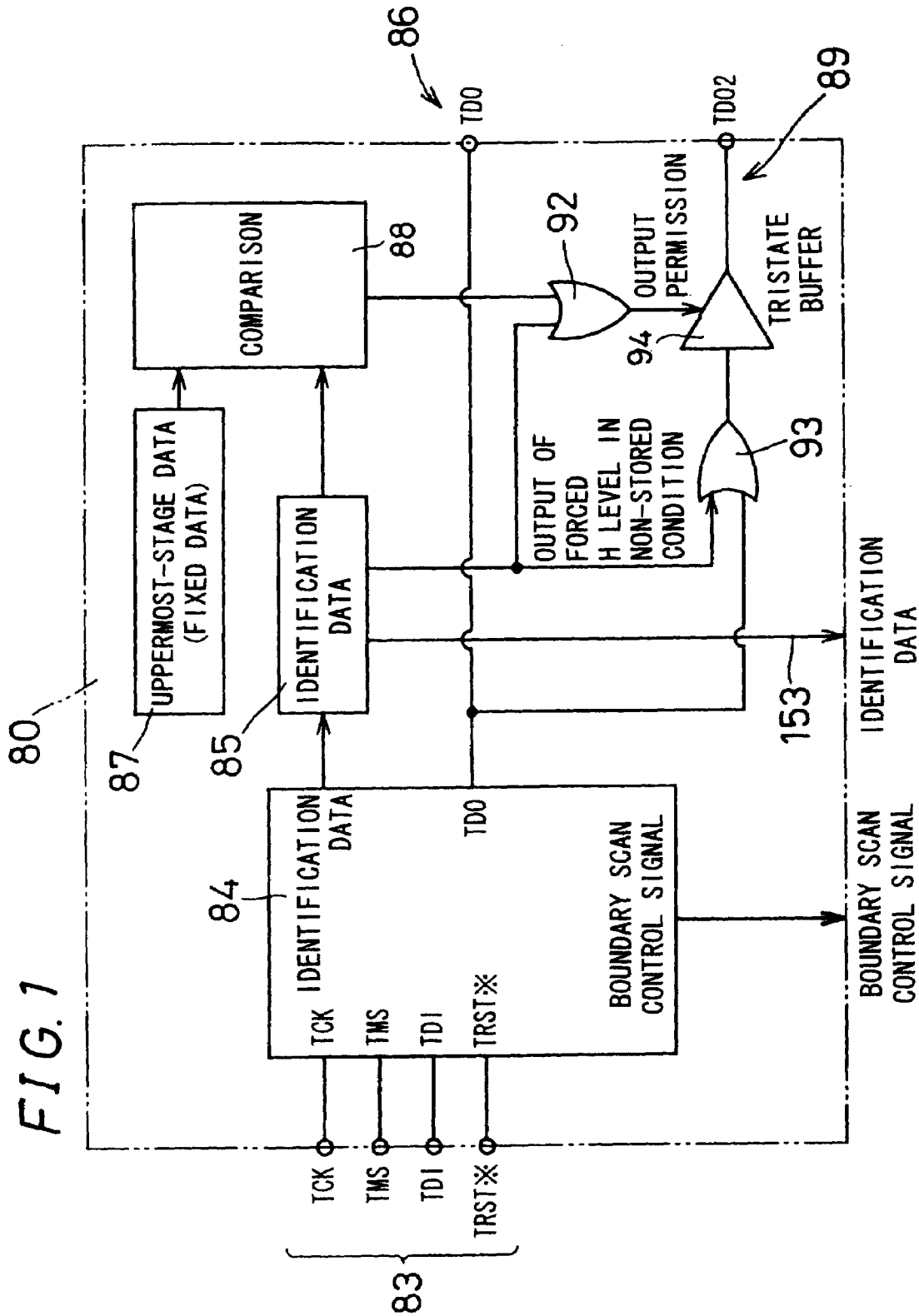
FIG. 1 is a block diagram showing a boundary scan controller 80 according to one embodiment of the invention.

Now referring to the drawings, preferred embodiments of the invention are described below.

Figure 2:
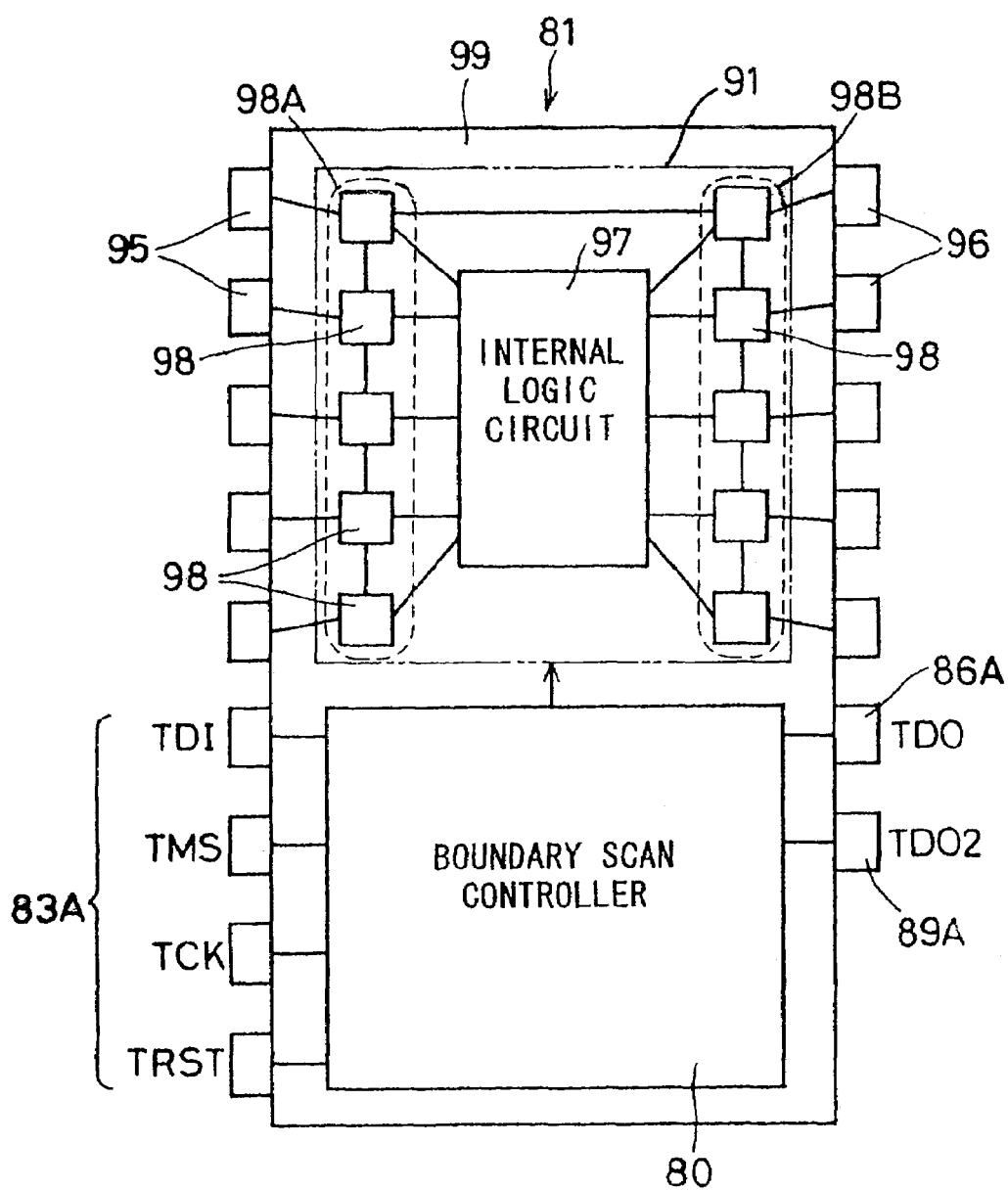
FIG. 2 is a block diagram showing a semiconductor circuit chip assembly 81 which is configured by disposing the boundary scan controller 80 in a semiconductor circuit chip.
Figure 3:
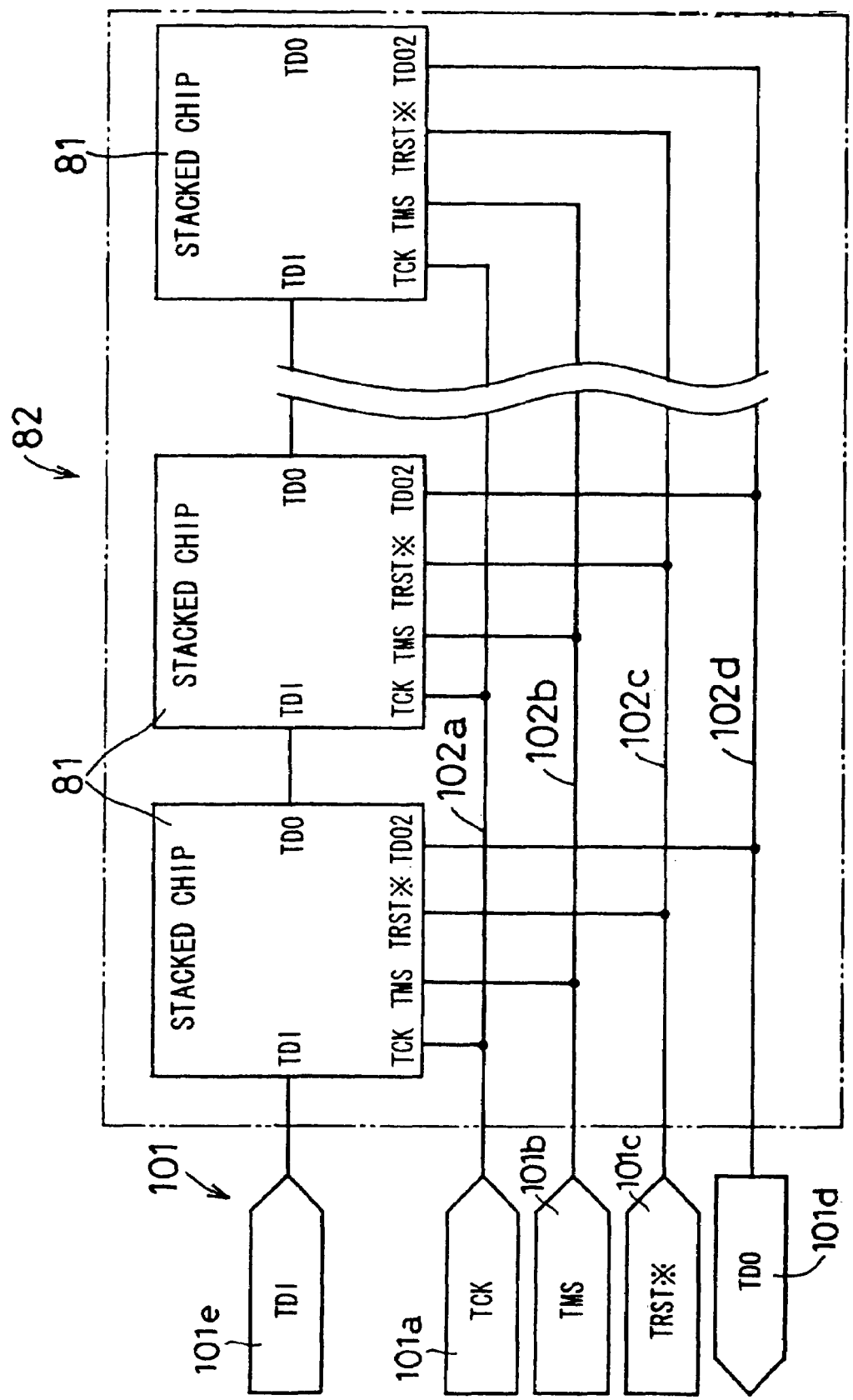
FIG. 3 is a block diagram showing a semiconductor apparatus 82 which is configured by stacking a plurality of such semiconductor circuit chip assemblies 81.

FIG. 1 is a block diagram showing a boundary scan controller 80 according to one embodiment of the invention. FIG. 2 is a block diagram showing a semiconductor circuit chip assembly 81 which is configured by disposing the boundary scan controller 80 in a semiconductor circuit chip. The number of the connection terminals between an internal logic circuit 97 and the exterior is assumed to be 10. FIG. 3 is a block diagram showing a semiconductor apparatus 82 which is configured by stacking a plurality of such semiconductor circuit chip assemblies 81. The boundary scan controller 80 of this embodiment operates in conformity with the standards of the JTAG (Joint European Test Action Group). The boundary scan controller 80 is a circuit for electrically testing whether or not the semiconductor circuit chip is connected in the semiconductor apparatus 82.

The boundary scan controller 80 includes an input section 83, control means 84, storage means 85, an output section 86, fixed-data holding means 87, comparison means 88 and a data derivation section 89. Hereinafter, the boundary scan controller 80 will be simply stated as "controller 80" in some cases.

The input section 83 is a serial interface for inputting a predetermined operation instruction, and the identification data and test data of the semiconductor circuit chip. This input section 83 includes four signal lines; TCK (Test Clock input: clock input part), TMS (Test Mode Select input: test mode input part), TDI (Test Data input: data input part), and TRST (Test Reset input: test reset input part). Hereinafter, the identification data of the semiconductor circuit chip will be simply stated as "identification data" in some cases.

The signal line TCK is a signal line which supplies the control means 84 with input/output timings, and which feeds a testing clock independent of a peculiar system clock. The signal line TMS is a signal line which inputs the predetermined operation instruction so as to control a test operation. The signal line TDI is a signal line which serially inputs the identification data and the test data. The signal line TRST is a signal line which inputs data for asynchronously initializing the controller 80. These four signal lines are controlled by an external JTAG tester, and a boundary scan test is performed. Although the signal line TRST is laid in the input section 83 in this embodiment, it is an optional terminal in the JTAG standards, and the input section 83 may be configured having the three signal lines TCK, TMS and TDI, in another embodiment of the invention.

The input section 83 is interconnected with the control means 84, and supplies the control means 84 with the predetermined operation instruction, identification data and test data provided from the JTAG tester.

When the operation instruction of storing the identification data in the storage means 85 is input from the input section 83, the control means 84 executes this instruction, and decodes the identification data received from the input section 83 and stores the decoded data in the storage means 85. Besides, when the operation instruction of performing the boundary scan test is input from the input section 83, the control means 84 executes this instruction, and performs the circuit test employing the test data received from the input section 83, thereby to obtain test result data. The reserved code of the boundary scan instruction, for example, is assigned as the operation instruction of storing the identification data in the storage means 85. In the case of performing the circuit test, the control means 84 outputs a boundary scan control signal and controls a shift register circuit 91 to be stated later.

The control means 84 includes an instruction register and a test data register. The instruction register serves to set an instruction code for accepting instruction data for performing the boundary scan test. The test data register serves to set test pattern data for performing the boundary scan test. Both the instruction register and the test data register have the configurations of shift registers, and when the instruction of sending data is input to the control means 84, the predetermined operation instruction and various data which are input from the signal line TDI can be output from a signal line TDO (Test Data Output: data output part) through the shift registers. Hereinafter, the predetermined operation instruction and the various data will be generally and simply stated as "data" in some cases.

The storage means 85 stores therein the identification data decoded by the control means 84. This storage means 85 is a latch circuit constructed of a flip-flop, and it is configured so as to receive the identification data again every turn-ON of the power source of the JTAG tester which is externally connected for performing the boundary scan test.

Since the identification data is merely designated in this case, the JTAG tester can also be substituted by a circuit which generates a JTAG signal in simplified fashion by a ROM (Read Only Memory) and a clock generator, or the like, without being made a complete JTAG tester.

In another embodiment of the invention, the storage means 85 may be incarnated by a nonvolatile memory such as EPROM (Electrically Programmable Read Only Memory) and configured so that the identification data may be saved merely by storing this identification data once.

The storage means 85 has a storage area which is one bit larger than the bit length of the identification data. That is, the data to be stored in the storage means 85 has its bit length made one bit larger than the bit length of the identification data. Whether or not the identification data has been stored in the storage means 85 by the control means 84, is stored in the redundant one bit. Thus, whether or not the identification data is stored in the storage means 85 is easily judged.

The output section 86 is a serial interface which serves to output the test result data obtained by the control means 84, and the predetermined operation instruction and the various data which is outputted from the control means 84 through the instruction register and the test data register, and which includes the signal line TDO.

The fixed-data holding means 87 holds fixed data therein. The fixed data is the identification data of the semiconductor circuit chip which is arranged at the uppermost stage when the semiconductor apparatus 82 is configured by stacking the plurality of semiconductor circuit chip assemblies 81 each being configured with the controller 80 disposed in the semiconductor circuit chip. The semiconductor circuit chip which is arranged at the uppermost stage is located at the remotest position from a circuit board when the semiconductor apparatus 82 is mounted on the circuit board.

The fixed-data holding means 87 is implemented by, for example, wired logic. In this embodiment, the fixed-data holding means 87 exists independently, but in still another embodiment of the invention, the fixed-data holding means 87 may be included in the comparison means 88 to be stated below, in a case where this fixed-data holding means 87 is configured by logic synthesis.

The comparison means 88 receives the identification data stored in the storage means 85, and the fixed data held in the fixed-data holding means 87, whereupon the comparison means makes a comparison as to whether or not the identification data and the fixed data are in agreement, so as to output comparison result information. This comparison means 88 compares the identification data stored in the storage means 85, with the fixed data under the condition that the data of the redundant one bit is included. Thus, whenever the identification data is not stored in the storage means 85, the comparison means 88 can output the comparison result information indicative of disagreement.

The data derivation section 89 includes first and second OR gates 92, 93, a tristate buffer 94 and a signal line TDO2. One of the input nodes of the first OR gate 92 is interconnected with the comparison means 88, and the other input node is interconnected with the storage means 85. The first OR gate 92 outputs an output permission signal to the tristate buffer 94 in a case where the comparison result information of the comparison means 88 indicates the agreement between the identification data and the fixed data, or when the identification data is stored in the storage means 85.

One of the input nodes of the second OR gate 93 is interconnected with the signal line TDO being the output section 86, and the other input node is interconnected with the storage means 85. The second OR gate 93 outputs the same data as the data which is outputted from the output section 86, in the case where the identification data is stored in the storage means 85. The data of the redundant one bit is input from the storage means 85 to the second OR gate 93.

The tristate buffer 94 is interconnected with the output nodes of the first and second OR gates 92, 93, and outputs the data received from the second OR gate 93, to the signal line TDO2 when the output permission signal has been received from the first OR gate 92.

In a case where the identification data is not stored in the storage means 85, the first and second OR gates 92, 93 operate so that the signal line TDO2 connected to the output node of the tristate buffer 94 may output data which the other boundary scan controllers cannot recognize. The "data which the other boundary scan controllers cannot recognize" termed here is the data which is always high (H). Thus, the same data as the data which is outputted from the output section 86 is not output from the data derivation section 89, and in effect, in spite of the existence of the boundary scan controllers which are connected in succession to the data derivation sections 89, the succeeding boundary scan controllers do not operate. Also in a case where the semiconductor circuit connected to the boundary scan controller is defective, this boundary scan controller does not operate, and hence, the input/output circuits fall into a disconnected state. By way of example, even when the defective semiconductor circuit chip is about to fall into an abnormal input/output pin state, no output is delivered, and any drawback is avoidable.

Besides, in a case where the identification data is stored in the storage means 85 and where the comparison result information which is outputted from the comparison means 88 indicates the agreement between the identification data and the fixed data, the first and second OR gates 92, 93 operate so that the same data as the data which is outputted from the output section 86 may be output from the signal line TDO2. That is, the same data as that of the output section 86 can be output from the data derivation section 89 of the desired semiconductor circuit chip assembly 81.

Besides, in a case where the identification data is stored in the storage means 85 and where the comparison result information which is outputted from the comparison means 88 indicates the disagreement between the identification data and the fixed data, the first and second OR gates 92, 93 operate so as to inhibit the tristate buffer 94 from delivering an output to the signal line TDO2 connected to the output node thereof and to bring this tristate buffer into a floating state. Thus, the same data as the data which is outputted from the output section 86 is not output from the data derivation section 89, and in effect, the data derivation section 89 can be brought into a state disconnected from the circuit.

According to the controller 80 thus far described, in spite of the same controllers 80, the different data can be output from the data derivation sections 89 in the controller 80 in which the fixed data and the identification data agree and the controller 80 in which the fixed data and the identification data disagree or in which the identification data is not recorded.

Although the data derivation section 89 includes the first and second OR gates 92, 93 and the tristate buffer 94 in this embodiment, the first and second OR gates 92, 93 and the tristate buffer 94 may be configured as logic incorporated by logic synthesis.

The semiconductor circuit chip assembly 81 includes the controller 80, external signal input terminals 95, external signal output terminals 96, the internal logic circuit 97, the shift register circuit 91, input section connection terminals 83A, an output section connection terminal 86A and a data derivation section connection terminal 89A. The external signal input terminals 95 form an interface for inputting signals from the exterior to the internal logic circuit 97. The external signal output terminals 96 form an interface for outputting signals from the internal logic circuit 97 to the exterior. The internal logic circuit 97 is an integrated circuit for realizing the essential functions of the semiconductor circuit chip, and the internal logic circuit is implemented by any desired circuit. This internal logic circuit 97 is, for example, a large scale integration (abbreviated to "LSI").

The controller 80, external signal input terminals 95, external signal output terminals 96, internal logic circuit 97, shift register circuit 91, input section connection terminals 83A, output section connection terminal 86A and data derivation section connection terminal 89A are formed in an identical wafer 99.

The shift register circuit 91 has a plurality of boundary scan cells 98. As shown in FIG. 2, the shift register circuit 91 has ten boundary scan cells 98. The boundary scan cells 98 are implemented by any register circuit. The individual boundary scan cells 98 are respectively interposed between the internal logic circuit 97 and the external connection terminals which are the external signal input terminals 95 and the external signal output terminals 96.

The shift register circuit 91 is configured in such a way that the boundary scan cells 98 are connected in series. The boundary scan cells 98 are disposed in the number of the external signal terminals of the internal logic circuit 97. Description will be continued assuming a case where the input signals are received from the external connection terminals on the left side of the internal logic circuit 97 as shown in FIG. 2, and where the output signals are outputted from the external connection terminals on the right side.

The input section connection terminals 83A of the boundary scan controller 80 form an interface for inputting data from the exterior to the respective signal lines of the input section 83. The output section connection terminal 86A is an interface for outputting data from the signal line of the output section 86. The data derivation section connection terminal 89A is an interface for outputting data from the signal line of the data derivation section 89.

The control means 84 is interconnected with the shift register circuit 91, and controls the shift register circuit 91 so as to perform a circuit test and to obtain test result data. In the circuit test, the control means 84 executes operations to be stated below. In a case where those boundary scan cells 98 of the shift register circuit 91 which are connected to the external signal input terminals 95 are generically named, they will be stated as "input side cells 98A", and in a case where the boundary scan cells 98 which are connected to the external signal output terminals 96 are generically named, they will be stated as "output side cells 98B".

First, when a boundary scan test state has begun, the connections of the signals between the internal logic circuit 97 and the external connection terminals are cut off as to both the input side cells 98A and the output side cells 98B, and the shift register of the control means 84 and the input side cells 98A, and the shift register of the control means 84 and the output side cells 98B are connected. Besides, serial test data are input from the signal line TDI through the input section connection terminals 83A and are stored in the shift register circuit 91. Thereafter, the test data stored in the shift register circuit 91 are transmitted to the external connection terminals through the input side cells 98A and the output side cells 98B in compliance with a test performance instruction. Further, the states of the external connection terminals are monitored back and are stored in the shift register circuit 91 in compliance with an update instruction.

Subsequently, the monitored-back states of the external connection terminals as stored in the shift register circuit 91 are serially outputted from the output section TDO.

Besides, in some boundary scan test modes, self-tests are carried out using the input side cells 98A as well as the internal logic circuit 97 and the output side cells 98B as well as the internal logic circuit 97. In this case, merely the connections of the boundary scan cells 98 are altered, and the setting of test data and the derivation of monitored-back states are similar.

Such operations are performed as may be needed, whereby the control means 84 can obtain test result data which indicate the states monitoring back whether or not the semiconductor circuit chip to be stacked is normally connected (is normally operating).

The semiconductor apparatus 82 is configured by stacking the semiconductor circuit chip assemblies 81 as described above. Referring to FIG. 3, the semiconductor circuit chip assemblies 81 which are indicated in a region enclosed within a phantom line are stacked. Hereinafter, an article in which the semiconductor circuit chip assemblies 81 are stacked will be sometimes stated as "multilayered module".

A connector 101 is disposed in the semiconductor apparatus 82, and the JTAG tester is connected to the connector 101. In FIG. 3, the semiconductor circuit chip assemblies 81 which are stacked at the lowermost stage, middle stage and uppermost stage in succession from the left are shown. Besides, although only the three semiconductor circuit chip assemblies 81 are shown in FIG. 3, the semiconductor apparatus 82 may be configured by stacking any desired number of semiconductor circuit chip assemblies 81.

The signal lines TCK of the respective semiconductor circuit chip assemblies 81 are connected to an identical bus line 102a, and are interconnected with the corresponding TCK pin 101a of the connector 101. Likewise to the signal lines TCK, the signal lines TMS, TRST and TDO2 are respectively connected to identical bus lines 102*b*, 102*c* and 102*d* and are connected to the corresponding TMS pin 101*b*, TRST pin 101*c* and TDO2 pin 101*d* of the connector 101 in parallel with one another.

The output section connection terminals 86A of the semiconductor circuit chip assemblies 81 on the preceding-stage sides are successively connected to the input section connection terminals 83A corresponding to the signal lines TDI of the semiconductor circuit chip assemblies 81 on the succeeding-stage sides. Besides, the signal line TDI of the semiconductor circuit chip assembly 81 at the first stage is connected to the corresponding TDI pin 101*e* of the connector 101. The signal line TDO of the semiconductor circuit chip assembly 81 at the uppermost stage is non-connected.

In this manner, in the semiconductor apparatus 82, the individual controllers 80 are connected in the shape of a chain. Hereinafter, the chain-like connection will be sometimes stated as "daisy chain". In the semiconductor apparatus 82, the controllers 80 are controlled by the JTAG tester through the connector 101, whereby all the semiconductor circuit chip assemblies 81 can be simultaneously subjected to the boundary scan test.

Next, a method of setting the identification data will be described.

Figure 4:
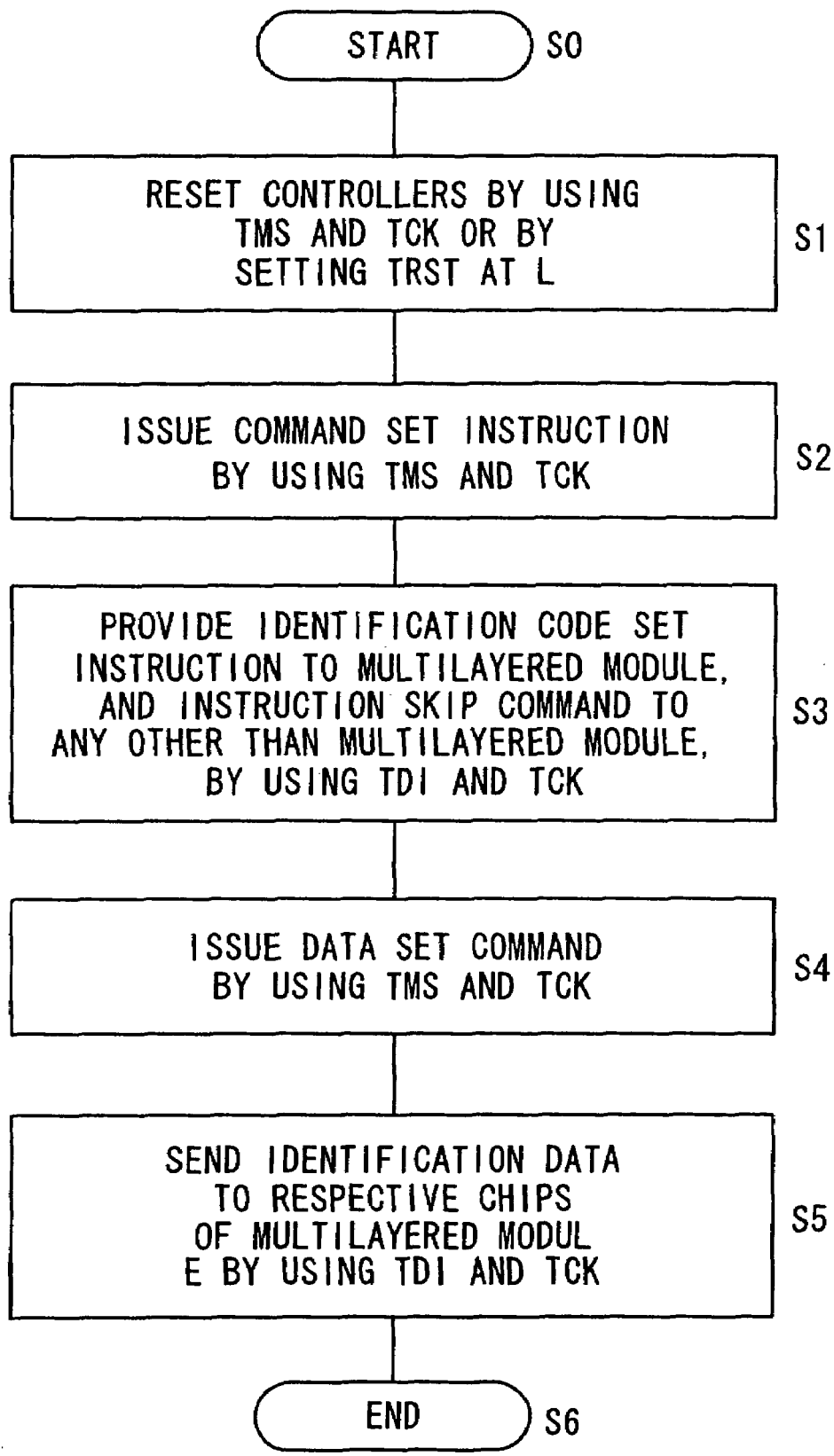
FIG. 4 is a flow chart showing the operation of setting the identification data in the storage means 85 of the controllers 80.

FIG. 4 is a flow chart showing the operation of setting the identification data in the storage means 85 of the controllers 80. When the external JTAG tester has been connected to the semiconductor apparatus 82 at a step S0, the routine shifts to a step S1. At the step S1, the control means 84 of the controllers 80 are reset from the input sections 86 by employing the signal lines TMS and TCK or by setting the signal level of the signal line TRST at an L level. In the boundary scans, whatever states the control means 84 are in, these control means 84 can be reset by setting the signal levels of the signal lines TMS at an H level and holding this state for 5 clock cycles.

Subsequently, the routine shifts to a step S2, at which a command set instruction that is an instruction for inputting an operation instruction to the control means 84 is input by employing the signal lines TMS and TCK, whereupon the routine shifts to a step S3.

At the step S3, the operation instruction which gives an identification code set instruction for causing the storage means 85 to store the identification data therein is provided to the control means 84 of the controllers 80 disposed in the stacked semiconductor circuit chips, by employing the signal lines TDI and TCK. Besides, an instruction skip command (bypass instruction) for skipping the instruction is provided to the control means 84 of a controller 80 disposed in any semiconductor circuit chip which is not stacked.

Subsequently, the routine shifts to a step S4, at which a data set command that is the operation instruction for inputting data to the control means 84 is input by employing the signal lines TMS and TCK, whereupon the routine shifts to a step S5.

At the step S5, the identification data are sent to the controllers 80 disposed in the respective stacked semiconductor circuit chips, by employing the signal lines TDI and TCK, whereupon the routine shifts to a step S6 so as to end the operation. At the step 5, as the identification data, data which are to be stored in the storage means 85 of the controllers 80 disposed in the stacked semiconductor circuit chips are provided through the signal lines TDI and TDO being the daisy-chain data lines, so as to respectively have different values. By way of example, "0" is provided as the identification data to the storage means 85 disposed in the semiconductor circuit chip at the uppermost stage, and "1" is afforded as the identification data to the storage means 85 disposed in the semiconductor circuit chip at the stage directly below the uppermost stage. Besides, "m" is provided as the identification data to the storage means 85 disposed in the semiconductor circuit chip at the mth stage (where $\underline{m}$ denotes an integer of at least 2) as reckoned from the uppermost stage.

Even in a case where the controllers 80 of the stacked semiconductor circuit chip assemblies 81 and the ordinary controllers disposed in the ordinary semiconductor devices (not shown) which are not stacked form a daisy chain, the number of the stacked semiconductor circuit chips and the number of the ordinary controllers disposed up to the multi-layered module consisting of the stacked semiconductor circuit chips are known beforehand, and hence, there is no problem to create the identification data which are provided to the storage means 85 disposed in the stacked semiconductor circuit chips.

Further, even in a case where the controller of still another device is connected behind the daisy chain which is constituted by the controllers 80 of the stacked semiconductor circuit chip assemblies 81, no problem is posed for the reason that, when the identification data is not stored in the storage means 85 disposed in the stacked semiconductor circuit chip assembly 81, the output of the data derivation section 89 is fixed at the H level, while the command for skipping the instruction is provided to the control means 84 included in the controller 80.

Owing to the flow chart thus far described, the identification data can be stored in the controllers 80 disposed in the stacked semiconductor circuit chips.

In the controller 80 in which the identification data is not stored in the storage means 85, the data which is outputted from the output section 86 is the output of the boundary scan, and the signal line TDO2 of the data derivation section 89 outputs the signal of the H level.

The controller 80 which has been supplied with the same identification data as the identification data of the semiconductor circuit chip at the uppermost stage in each stacked semiconductor circuit chip assembly 81, namely, with "0" in the above example, has its setting altered so that the same data as the data which is outputted from the output section 86 may be output from the data derivation section TDO2. Besides, the controller 80 which has been supplied with the identification data different from the identification data of the semiconductor circuit chip at the uppermost stage is disconnected from the data derivation section TDO2.

In a case where a plurality of multilayered modules exist on the daisy chain of boundary scans, the operating procedure shown in FIG. 4 may be iterated so as to successively perform settings.

Figure 5:
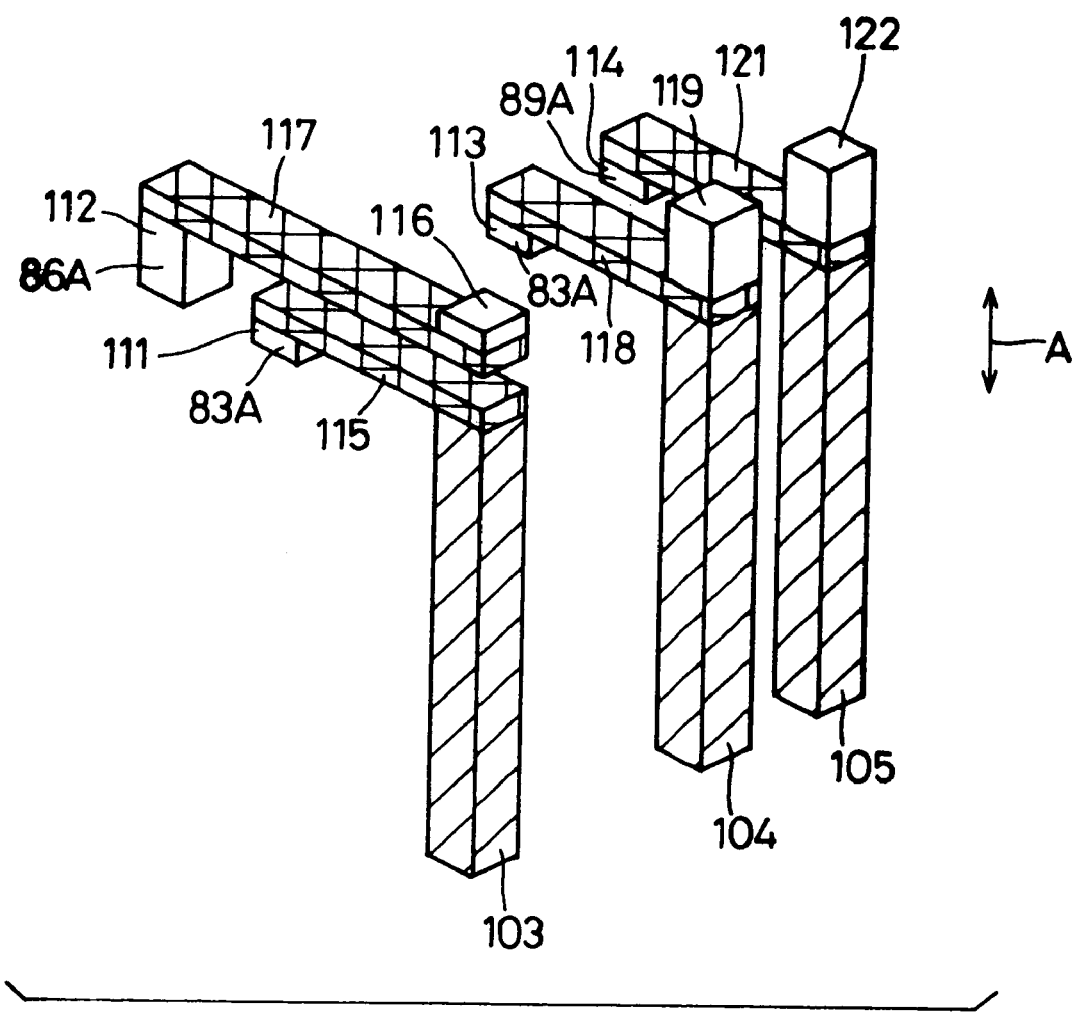
FIG. 5 is a perspective view showing part of the wiring pattern of the semiconductor circuit chip assembly 81 which is formed by disposing the controller 80 in the semiconductor circuit chip.

FIG. 5 is a perspective view showing part of the wiring pattern of the semiconductor circuit chip assembly 81 which is formed by disposing the controller 80 in the semiconductor circuit chip. The semiconductor circuit chip assembly 81 includes first-third penetrating electrodes 103-104. For the sake of description, only the first-third penetrating leads 103-105 which penetrate through the semiconductor circuit chip assembly 81, and wiring lines which extend between these first-third penetrating leads 103-105 and the connection terminals 83A, 86A, 89A of the semiconductor circuit chip assembly 81, are illustrated in FIG. 5, and the semiconductor circuit chip, inter-layer insulating films, etc. are not illustrated. The first-third penetrating electrodes 103-105 penetrate through the semiconductor circuit chip assembly 81 in the stacked direction of this semiconductor circuit chip assembly 81, namely, in the direction of arrow A in FIG. 5. Besides, the case of stacking the semiconductor circuit chip assembly 81 by face-up is illustrated here.

One surface of the semiconductor circuit chip assembly 81 is formed with the input section connection terminals 83A being the terminals of the input section 83, the output section connection terminal 86A being the terminal of the output section 86, and the data derivation section connection terminal 89A constructing the data derivation section 89. The input section connection terminals 83A are the terminal 111 of the signal line TDI, and the terminal 113 of the signal line TCK. Since the wiring lines for connecting the signal lines TCK, TMS and TRST, respectively, are similar, only the wiring line for connecting the signal line TCK is illustrated here. The output section connection terminal 86A is the terminal 112 of the signal line TDO. The data derivation section connection terminal 89A is the terminal 114 of the signal line TDO2.

One end part of the first penetrating electrode 103 is interconnected to the terminal 111 of the signal line TDI through the first connection line 115. The first connection line 115 is formed in one surface of the semiconductor circuit chip assembly 81. A first connection terminal 116 is interconnected with the other end part of the first penetrating electrode 103 of the stacked semiconductor circuit chip assembly 81. The first connection terminal 116 which is connected with the stacked semiconductor circuit chip assembly 81 is formed through an inter-layer insulating film over one end part of the first penetrating electrode 103. The terminal 112 of the signal line TDO is interconnected with the first connection terminal 116 through the second connection line 117 which is stacked on the first connection line 115 with the inter-layer insulating film interposed therebetween.

One end part of the second penetrating electrode 104 is interconnected to the terminal 113 of the signal line TCK through the third connection line 118. The third connection line 118 is formed in one surface of the semiconductor circuit chip assembly 81. A second connection terminal 119 which is connected with the stacked semiconductor circuit chip 81 is formed at one end part of the second penetrating electrode 104. The second connection terminal 119 is interconnected with the other end part of the second penetrating electrode 104 of the stacked semiconductor circuit chip assembly 81.

One end part of the third penetrating electrode 105 is interconnected to the terminal 114 of the signal line TDO2 through the fourth connection line 121. The fourth connection line 121 is formed in one surface of the semiconductor circuit chip assembly 81. A third connection terminal 122 which is connected with the stacked semiconductor circuit chip 81 is formed at one end part of the third penetrating electrode 105. The third connection terminal 122 is interconnected with the other end part of the third penetrating electrode 105 of the stacked semiconductor circuit chip assembly 81.

By laying the wiring lines in this manner, data which is input from the exterior of the semiconductor circuit chip assembly 81 is passed through the first penetrating electrode 103 and transmitted to the terminal 111 of the signal line TDI via the first connection line 115. Data which is output from the signal line TDO is sent from the terminal 112 through the second connection line 117 to the first connection terminal 116, from which the data is transmitted to the stacked semiconductor circuit chip assembly 81. Besides, the terminal 113 of the signal line TCK is connected to a common bus line, and the terminal 114 of the signal line TDO2 is connected to a common bus line.

When the semiconductor circuit chip assemblies 81 are stacked after forming the wiring lines as shown in FIG. 5, the upper and lower semiconductor circuit chip assemblies 81 can be stacked without being shifted, and hence, the semiconductor apparatus 82 can be formed in the smallest possible size.

As described above, when the semiconductor circuit chip assemblies 81 are configured by employing the controllers 80, the daisy chain for performing the boundary scan test can be formed by only one wiring pattern shown in FIG. 5. In stacking the same semiconductor circuit chips, accordingly, the semiconductor circuit chip assemblies 81 need not be separately fabricated. That is, the semiconductor circuit chip assemblies 81 can be formed by an identical wafer process, so that a labor for forming these semiconductor circuit chip assemblies 81 can be relieved. Besides, in the case of forming the semiconductor apparatus 82, the same semiconductor circuit chip assemblies 81 are stacked, so that a stacking order, etc. need not be considered, and a process is facilitated.

Although the case of stacking the semiconductor circuit chip assemblies 81 by the face-up has been explained in this embodiment, the semiconductor circuit chip assemblies 81 may be stacked by face-down. In this case, in FIG. 5, the terminal 111 of the signal line TDI may be set as the terminal of the signal line TDO, and the terminal 112 of the signal line TDO as the terminal of the signal line TDI.

Figure 6:
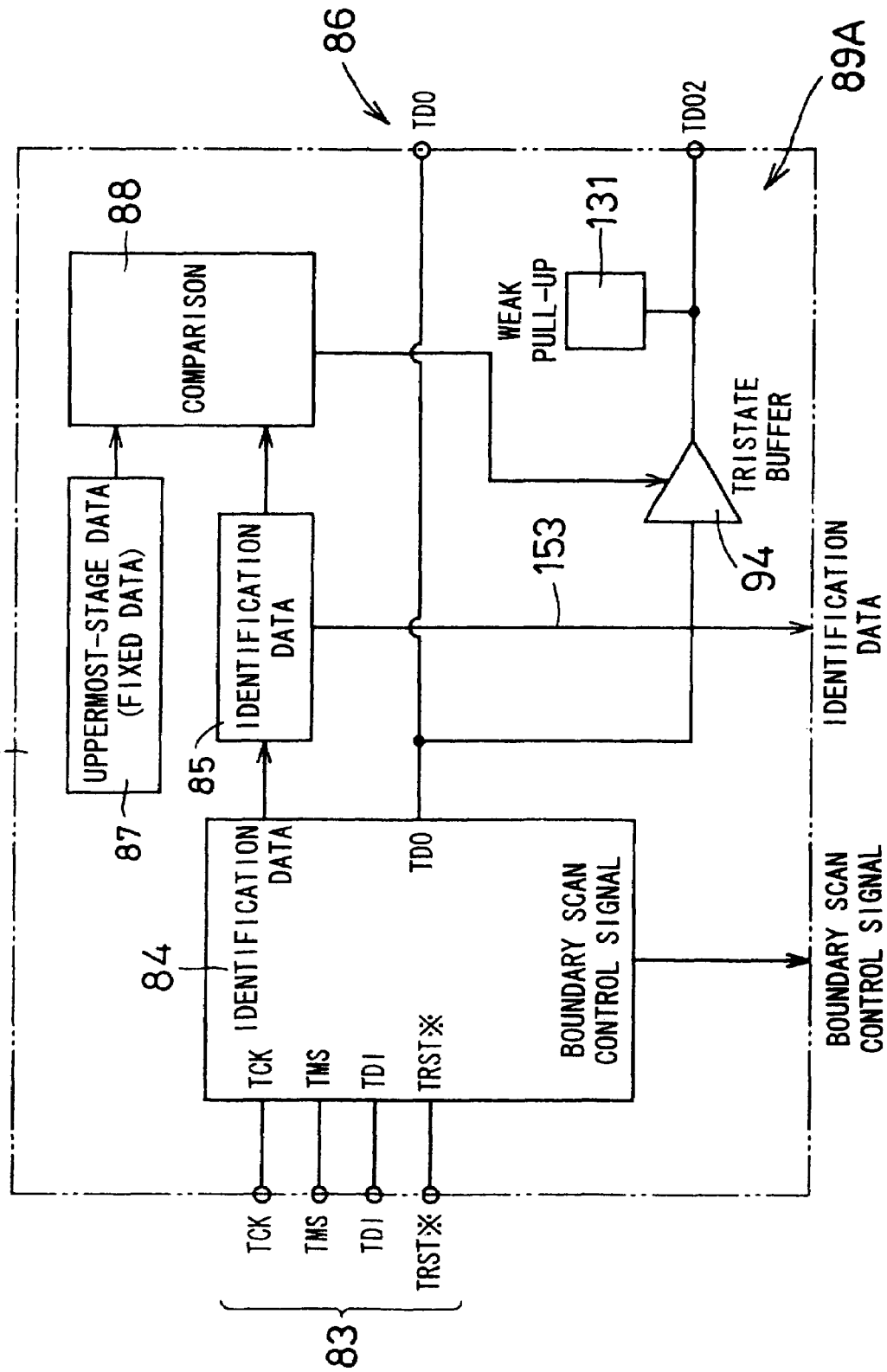
FIG. 6 is a block diagram showing a boundary scan controller 130 according to still another embodiment of the invention.

FIG. 6 is a block diagram showing a boundary scan controller 130 in still another embodiment of the invention. The boundary scan controller 130 includes an input section 83, control means 84, storage means 85, an output section 86, fixed-data holding means 87, comparison means 88 and a data derivation section 89A. Since the boundary scan controller 130 and the foregoing boundary scan controller 80 shown in FIG. 1 differ only in the configuration of the data derivation section 89A, the same reference numerals are assigned to the same portions, of which description shall be omitted. Hereinafter, the boundary scan controller 130 will be simply stated as "controller 130" in some cases.

The data derivation section 89A includes a tristate buffer 94, pull-up means 131 and a signal line TDO2. The tristate buffer 94 is interconnected with the comparison means 88, and a signal line TDO being the output section 86. In a case where comparison result information which is output from the comparison means 88 indicates the agreement between identification data and fixed data, the tristate buffer 94 outputs the same data as the data which is outputted from the output section 86. The input node of the tristate buffer 94 is interconnected with the signal line TDO, and the output node thereof is interconnected with the signal line TDO2.

On the other hand, in a case where the comparison result information which is output from the comparison means 88 indicates the disagreement between the identification data and the fixed data, the tristate buffer 94 is inhibited from outputting input data.

The pull-up means 131 is connected to the signal line TDO2 and a power source, and always feeds the signal line TDO2 with a feeble current from a plus (+) side supply voltage so as to weakly pull up this signal line TDO2. Thus, even when the output of the tristate buffer 94 is inhibited, the signal level of the signal line TDO2 becomes a predetermined signal level. The "predetermined signal level" is a high (H) level.

Besides, since the current which is fed from the pull-up means 131 to the signal line TDO2 is feeble, the signal level of the signal line TDO2 becomes a low (L) level in a case where a signal at the L level has been fed from the tristate buffer 94 or any device outside a semiconductor circuit chip control apparatus 81.

In order to incarnate the weak pull-up means 131, in the case of employing a TTL (Transistor Transistor Logic) circuit by way of example, this means can be implemented by inserting a high resistance between the plus (+) side supply voltage (Vcc) and the output, and in the case of employing CMOS (Contemporary Metal Oxide Semiconductor), this means can be implemented by inserting a P-channel transistor whose drain-source resistance is high, between the plus (+) side supply voltage (Vdd) and the output with a gate voltage set so that the transistor may fall into its ON state. The gate voltage may be fixed to a − side supply voltage.

If the controller or the semiconductor circuit chip itself should be defective to output the signal of the minus (−) level from the signal line TDO2, the power source might short-circuit to exert influence even on the other stacked semiconductor circuit chips, but such a drawback can be prevented by weakly pulling up the signal line TDO2.

Moreover, as compared with the foregoing controller 80, the controller 130 can simplify a circuit arrangement and can attain reduction in size.

The semiconductor circuit chip assembly including the controller 130, and a semiconductor apparatus configured by stacking a plurality of such semiconductor circuit chip assemblies are respectively similar to the semiconductor circuit chip assembly 81 and the semiconductor apparatus 82 described before. Also, a method of setting the identification data is similar to the method in the case of the controller 80 of the foregoing embodiment.

Figure 7:
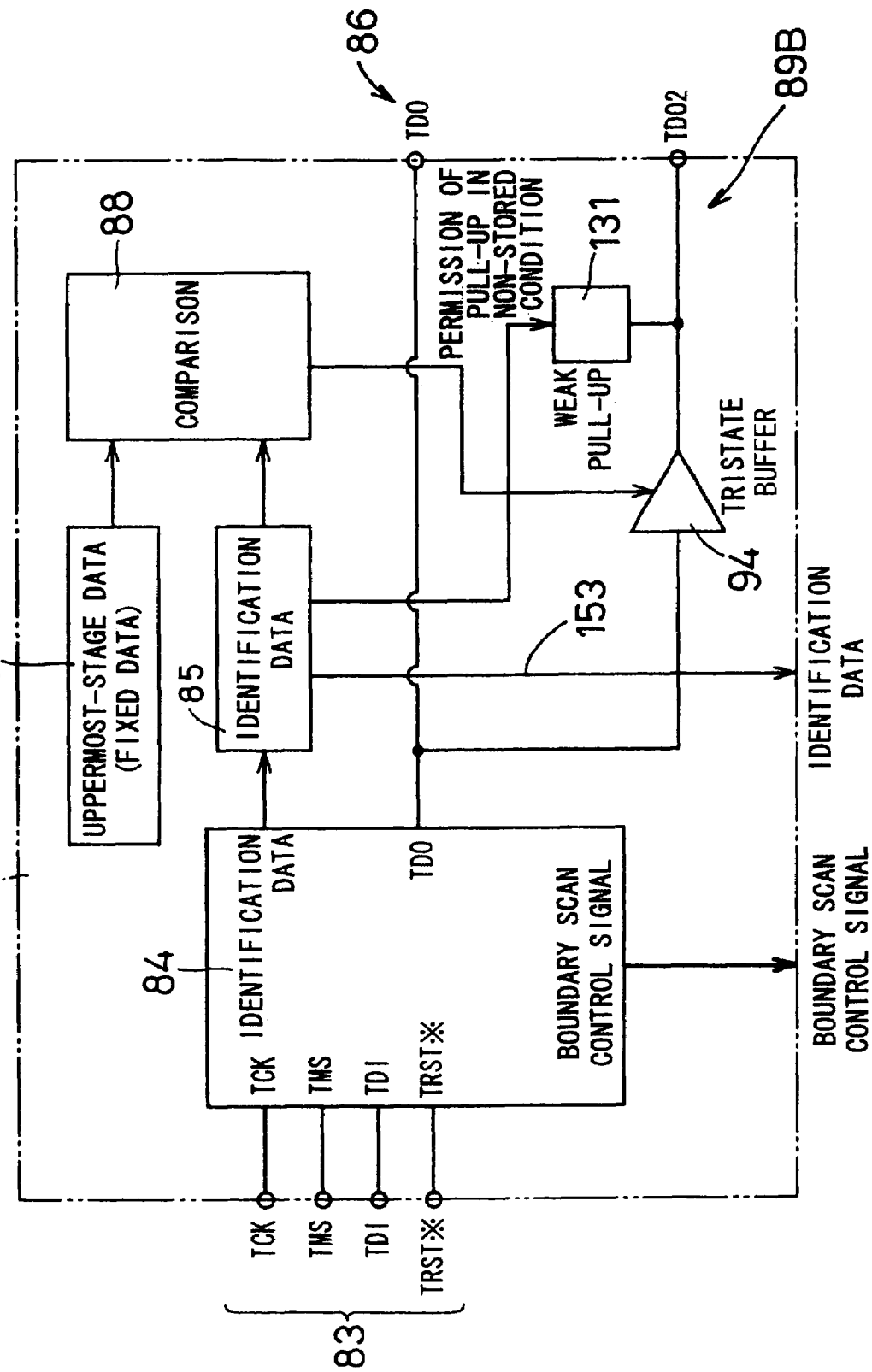
FIG. 7 is a block diagram showing a boundary scan controller 140 according to still another embodiment of the invention.

FIG. 7 is a block diagram showing a boundary scan controller 140 in still another embodiment of the invention. The boundary scan controller 140 includes an input section 83, control means 84, storage means 85, an output section 86, fixed-data holding means 87, comparison means 88 and a data derivation section 89B. Since the boundary scan controller 140 and the foregoing boundary scan controller 80 or 130 shown in FIG. 1 or FIG. 6 differ only in the configuration of the data derivation section 89B, the same reference numerals are assigned to the same portions, and the descriptions thereof are omitted. Hereinafter, the boundary scan controller 140 will be simply stated as "controller 140" in some cases.

In this embodiment, the data derivation section 89B includes a tristate buffer 94, pull-up means 131 and a signal line TDO2. The pull-up means 131 is connected to the storage means 85, the signal line TDO2 and a power source, and in a case where identification data is not stored in the storage means 85, this pull-up means always feeds the signal line TDO2 with a feeble current from a plus (+) side supply voltage so as to weakly pull up the signal line TDO2. Thus, even when the output of the tristate buffer 94 is inhibited, the signal level of the signal line TDO2 becomes a predetermined signal level. The "predetermined signal level" is a high (H) level.

Besides, in a case where the identification data is stored in the storage means 85, the pull-up means 131 inhibits the pull-up of the signal line TDO2. Thus, in a case where the signal level which is outputted from the tristate buffer 94 is an L level, the current which flows from the plus (+) side supply voltage to the signal line TDO2 through the pull-up means 131 can be nullified, and dissipation power can be lowered.

In order to inhibit the pull-up of the signal line TDO2 based on the pull-up means 131, in the case of employing a TTL circuit by way of example, the inhibition can be implemented by inserting a high resistance between the plus (+) side supply voltage (Vcc) and the output, and inserting a transistor between this supply voltage and the inserted high resistance. The transistor is implemented by, for example, a P-N-P transistor. In the case of employing CMOS, the inhibition can be implemented by controlling the gate of a P-channel transistor of high resistance inserted between the plus (+) side supply voltage (Vdd) and the output.

A semiconductor circuit chip assembly including the controller 140, and a semiconductor apparatus configured by stacking a plurality of such semiconductor circuit chip assemblies are respectively similar to the semiconductor circuit chip assembly 81 and the semiconductor apparatus 82 described before. Also, a method of setting the identification data is similar to the method in the case of the controller 80 of the foregoing embodiment.

Since the identification data of every semiconductor circuit chip is stored in the storage means 85 of the controller 80, 130 or 140 of each embodiment, the semiconductor circuit chips which are disposed in the semiconductor apparatus 82 can be identified by the identification data.

According to a boundary scan controller in still another embodiment of the invention, a semiconductor circuit chip assembly including any of the boundary scan controllers 80, 130 and 140 may be provided with signal selection means 150 for selecting a signal line in accordance with identification data which is to be stored in the storage means 85.

Figure 8:
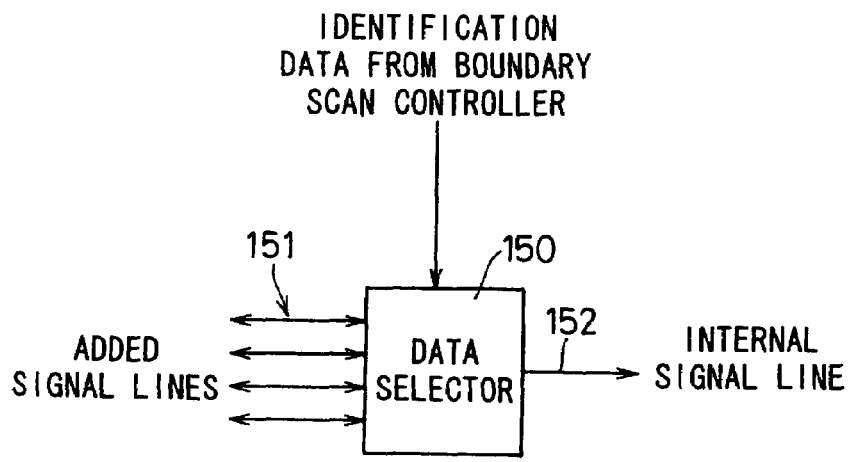
FIG. 8 is a block diagram showing the signal selection means 150.

FIG. 8 is a block diagram showing the signal selection means 150. A plurality of signal lines 151 for inputting signals from the exterior or outputting signals to the exterior are connected to the signal selection means 150. The signal selection means 150 connects the signal line 151 corresponding to the identification data among the plurality of signal lines 151, to an internal signal line 152. In the boundary scan controller 80, 130 or 140 described before, the signal lines 151 are additionally formed in each semiconductor circuit chip assembly in the number of the stacked semiconductor circuit chip assemblies by way of example.

As shown in FIG. 1, FIG. 6 or FIG. 7, an identification-data derivation line 153 for deriving the identification data stored in the storage means 85 is laid in the controller 80, 130 or 140 so as to input the identification data to the signal selection means 150. In the signal selection means 150, the corresponding signal line among the added signal lines 151 is selected, whereby each individual semiconductor circuit chip can be instructed to operate.

By way of example, when the signal lines 151 are assumed to be chip selection signal (abbreviated to "CS") lines, chip selection signals can be independently fed to the respective semiconductor circuit chip assemblies, and the identification of the stacked semiconductor circuit chips can be carried out using the chip selection signals.

The semiconductor circuit chip in which any of the boundary scan controllers 80, 130 and 140 described before is disposed is, for example, a memory chip, and the semiconductor apparatus is, for example, a memory module.

In still another embodiment of the invention, a memory chip assembly in which any of the boundary scan controllers 80, 130 and 140 is disposed in a memory chip may be provided with memory-chip selection means 160 for selecting the memory chip.

Figure 9:
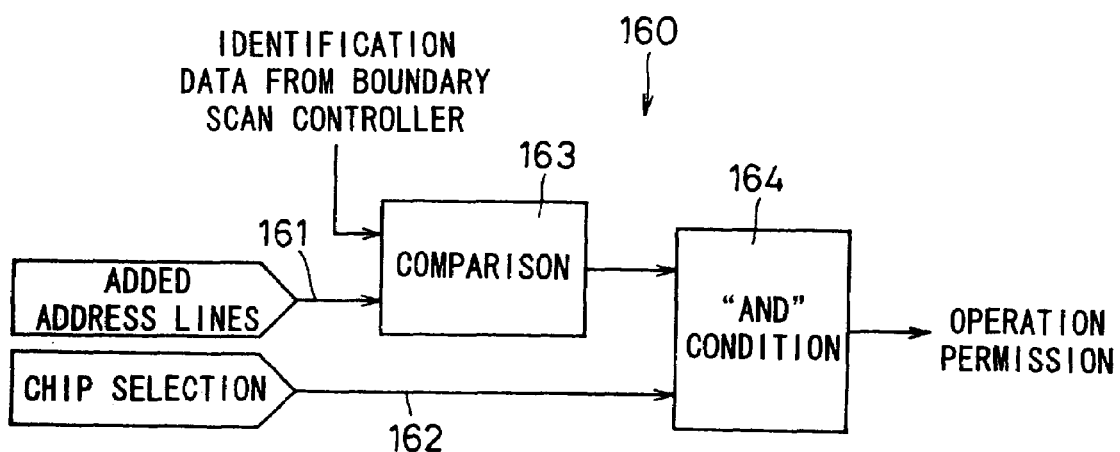
FIG. 9 is a diagram showing the memory-chip selection means 160 which is disposed in the memory chip assembly.

FIG. 9 is a diagram showing the memory-chip selection means 160 which is disposed in the memory chip assembly. The memory chip assembly includes additional address lines 161 which are formed in addition to the address line of the memory chip, a selection signal line 162 which inputs a selection signal for selecting the memory chip, and the memory-chip selection means 160.

The memory chip assembly is formed with the additional address lines 161 in the same number as the number of stacked memory chips. Besides, the memory chip assembly is formed with the selection signal line 162.

The memory-chip selection means 160 includes address comparison means 163 for comparing identification data stored in the storage means 85 and the addresses of the added address lines 161, and operation-permission-information output means 164 for outputting operation permission information on the basis of the comparison result information of the address comparison means 163 and the signal received from the selection signal line 162.

The address comparison means 163 is interconnected with the storage means 85 and the added address lines 161, and compares the identification data with the addresses of the added address lines 161. In a case where the identification data agrees with the address of the address line 161, the address comparison means 163 outputs the comparison result information indicative of the agreement.

The operation-permission-information output means 164 receives the comparison result information from the comparison circuit 163, and outputs operation permission information for permitting the operation of the particular memory chip, in a case where the comparison result information indicates the agreement between the identification data and the address of the address line 161 and where the selection signal for selecting the memory chip is input from the selection signal line 162.

In this manner, the identification data which is stored in the storage means 85 disposed in the memory chip assembly can be employed as an address. Accordingly, even in a case where the same selection signal is input from the selection signal line 162, the particular memory chip can be selected and operated because the respective stacked memory chips have the different addresses. Consequently, only the necessary memory chips can be selected and operated.

In still another embodiment of the invention, a memory chip assembly in which any of the boundary scan controllers 80, 130 and 140 is disposed in a memory chip may be provided with data-line selection means 170 for selecting data lines.

Figure 10:
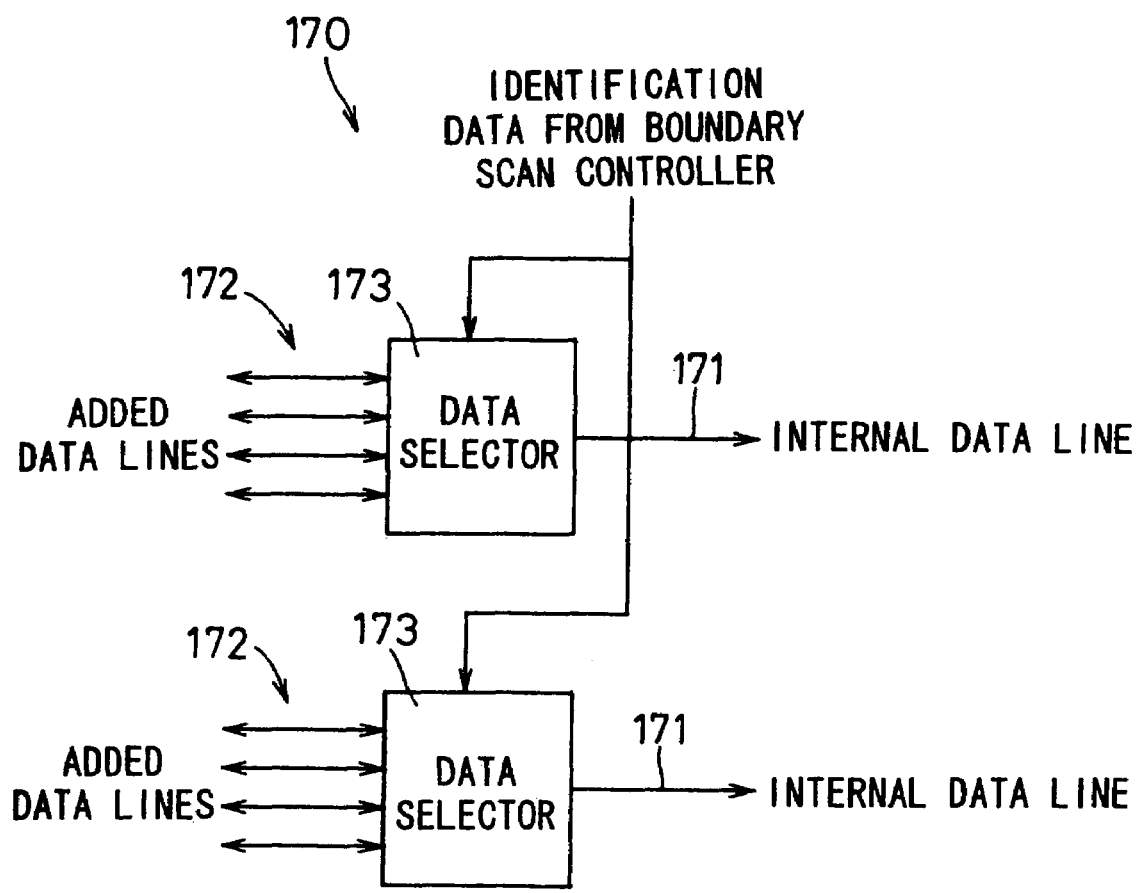
FIG. 10 is a diagram showing the data-line selection means 170 which is disposed in the memory chip assembly.
Figure 11:
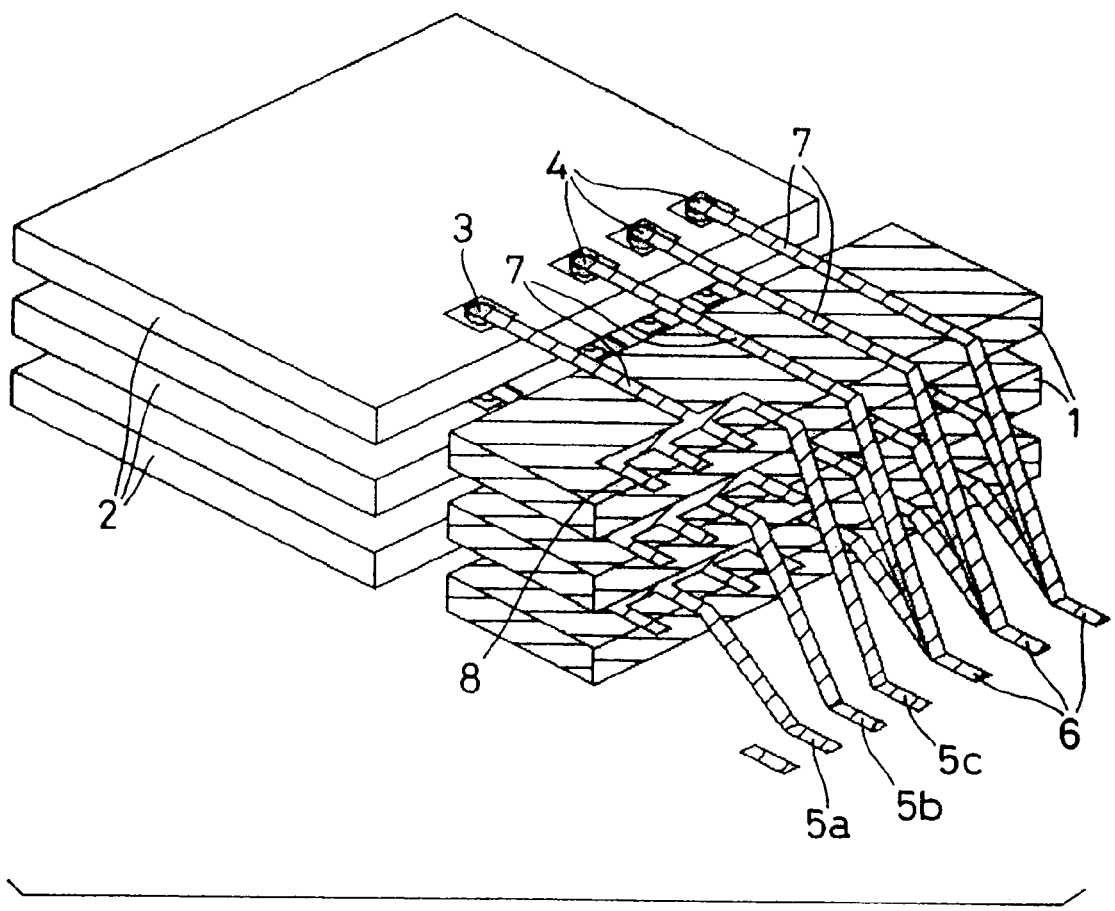
FIG. 11 is a perspective view showing a semiconductor apparatus in which chips 2 are stacked using tape carriers 1.
Figure 12:
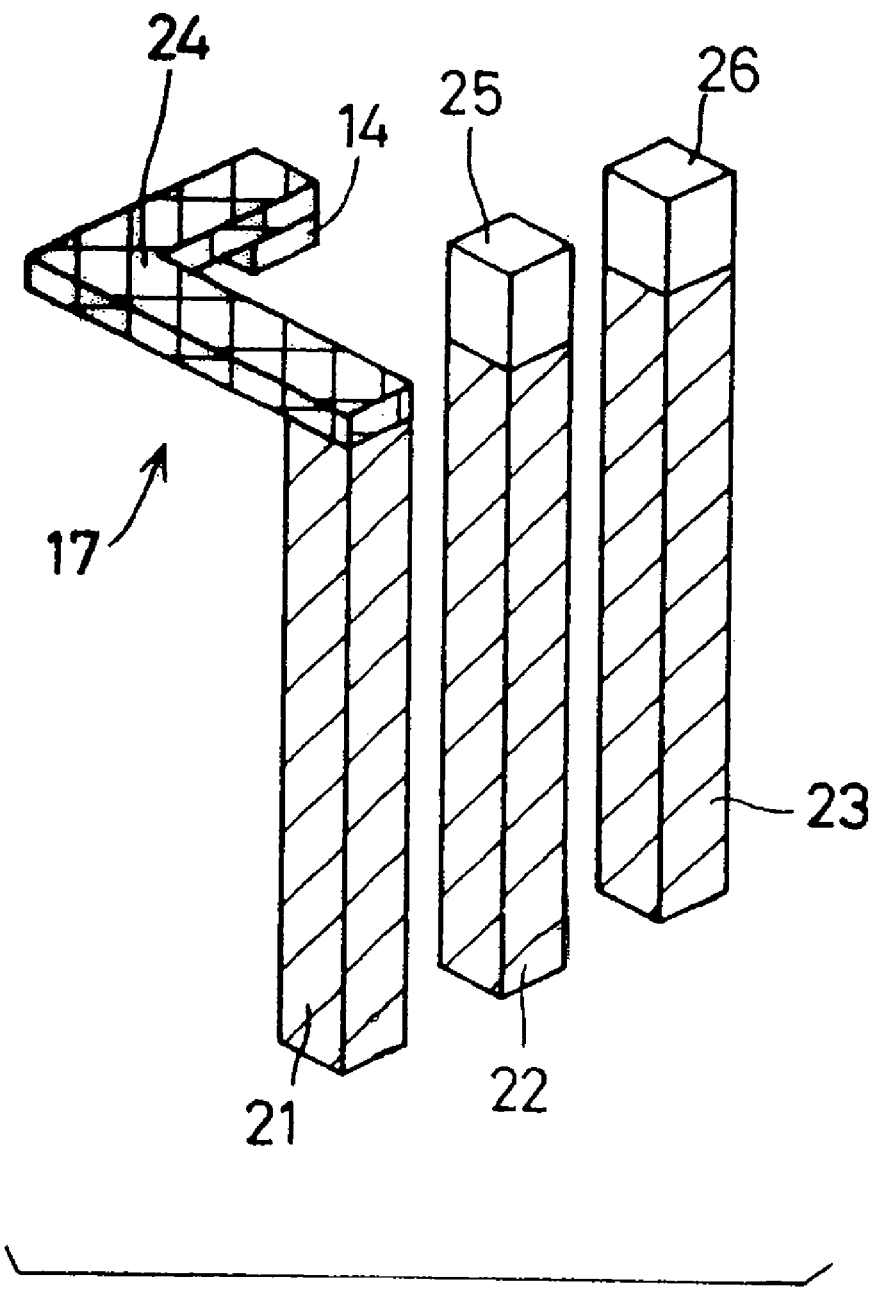
FIG. 12 is a view for explaining a semiconductor apparatus which is configured by stacking chips that have electrodes penetrating vertically through the chips.
Figure 13:
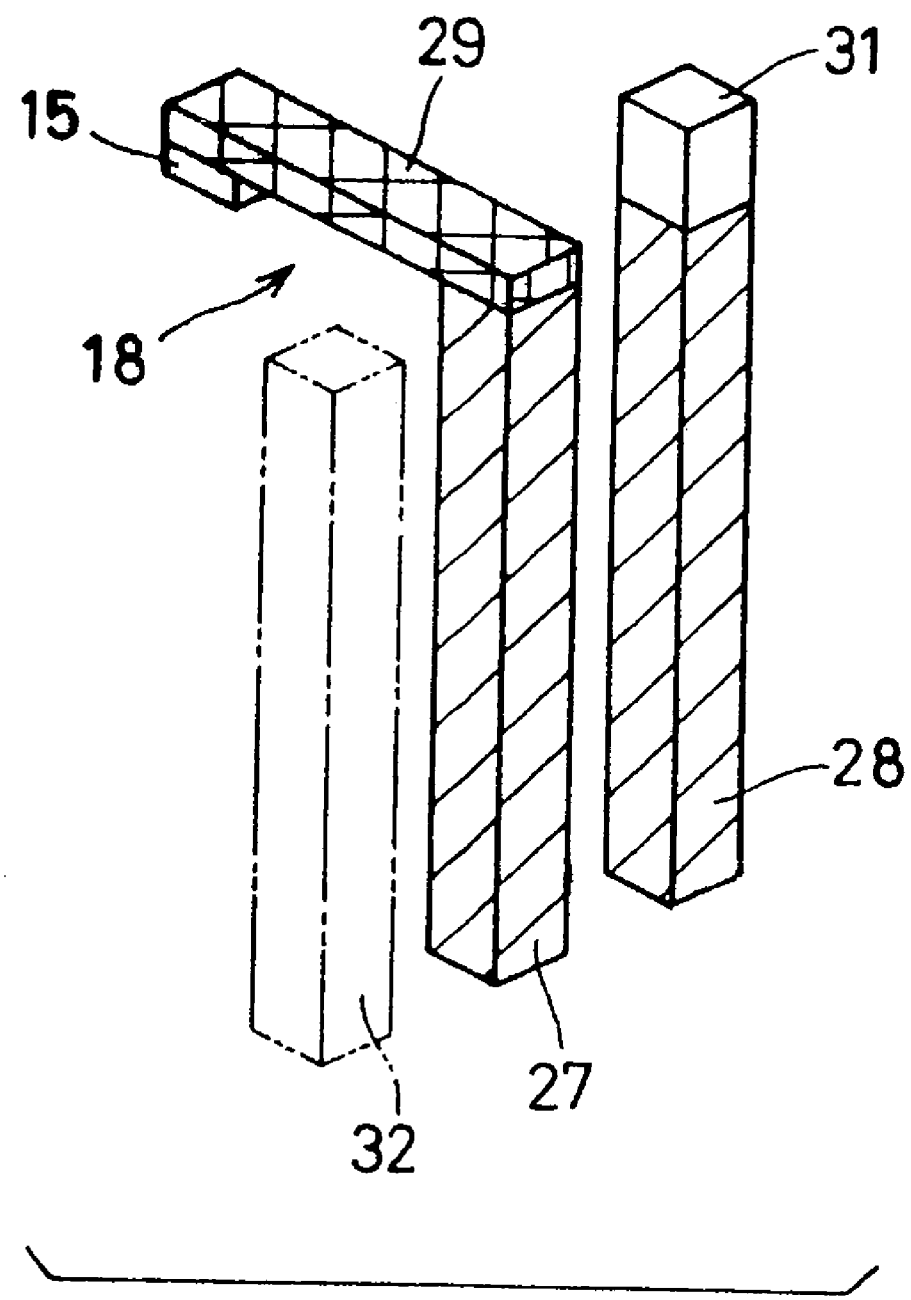
FIG. 13 is a view for explaining a semiconductor apparatus which is configured by stacking chips that have electrodes penetrating vertically through the chips.
Figure 14:
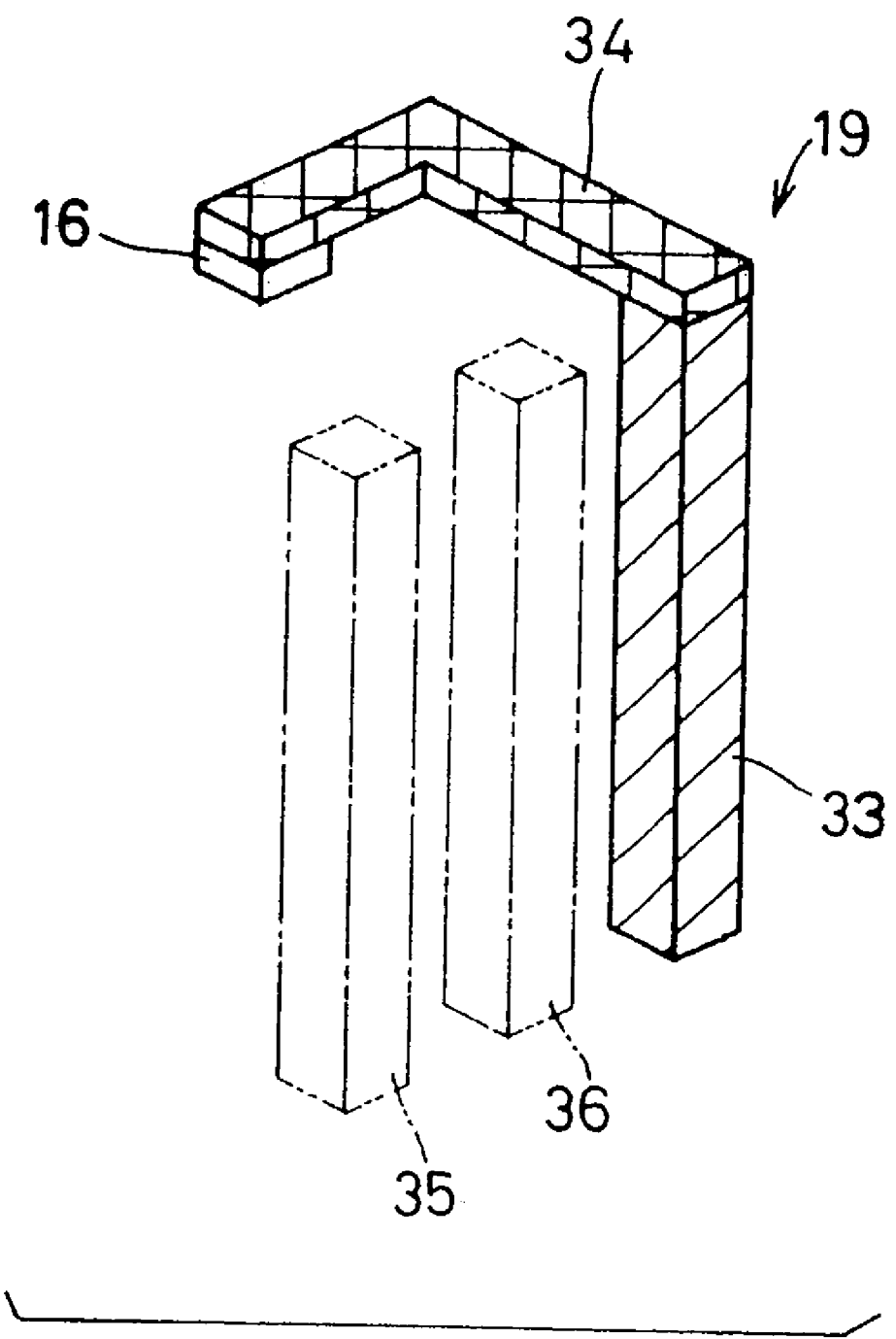
FIG. 14 is a view for explaining a semiconductor apparatus which is configured by stacking chips that have electrodes penetrating vertically through the chips.
Figure 15:
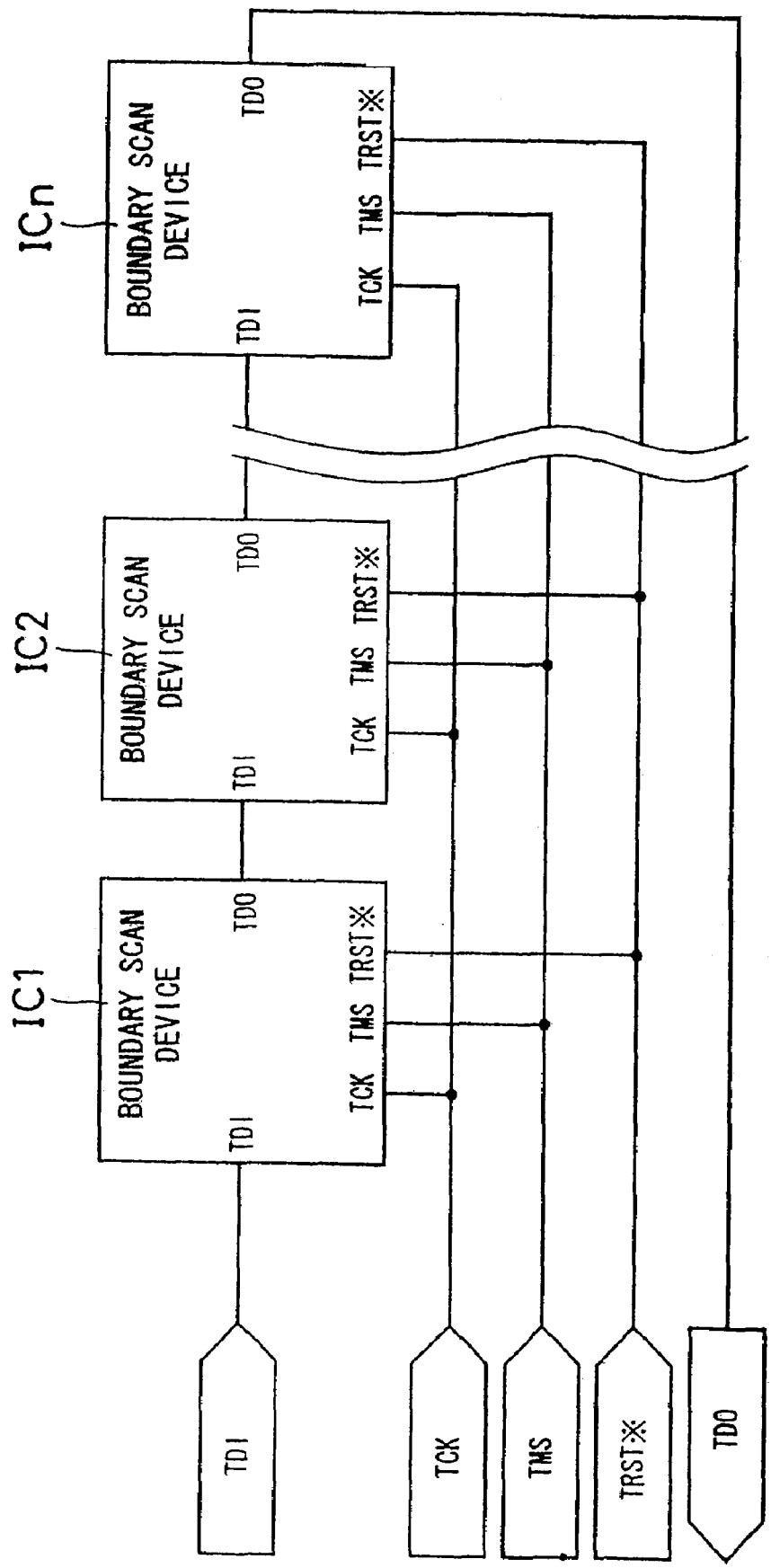
FIG. 15 is a view for explaining a technique of the boundary scan test.
Figure 16:
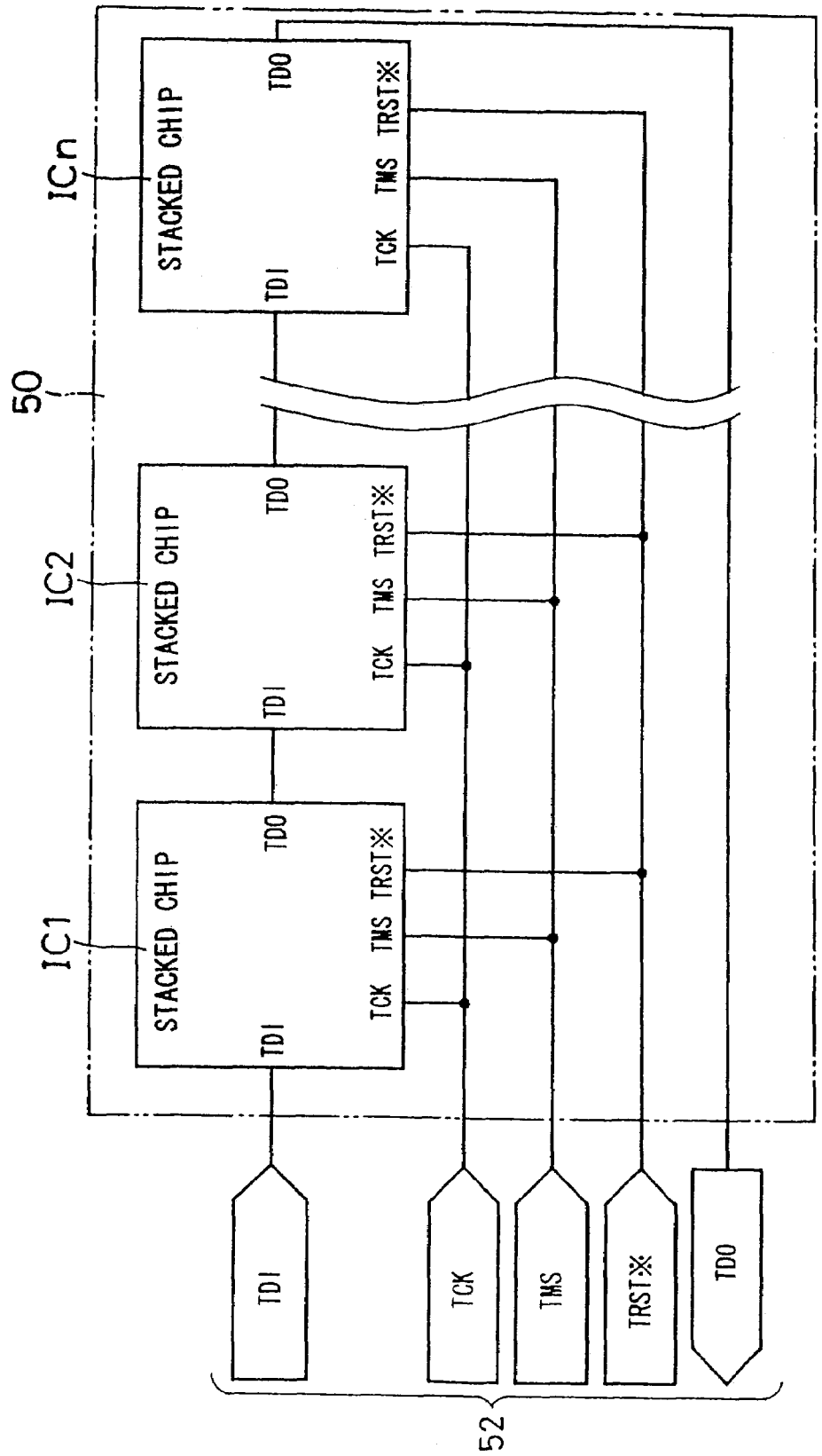
FIG. 16 is a view for explaining a technique of the boundary scan test.
Figure 17:
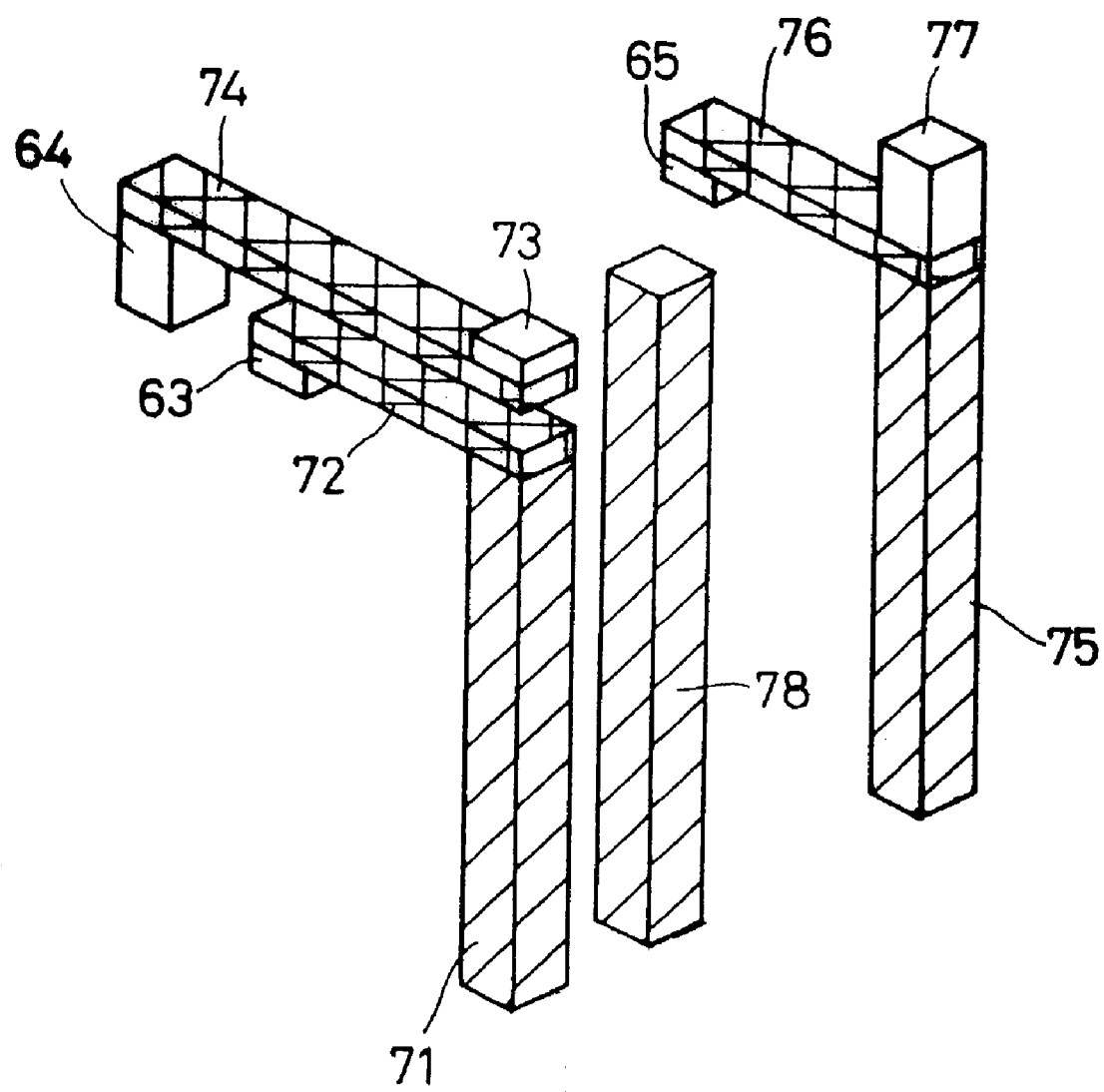
FIG. 17 is a perspective view showing the wiring patterns of the chip assemblies in the multilayered module 50 shown in FIG. 16.
Figure 18:
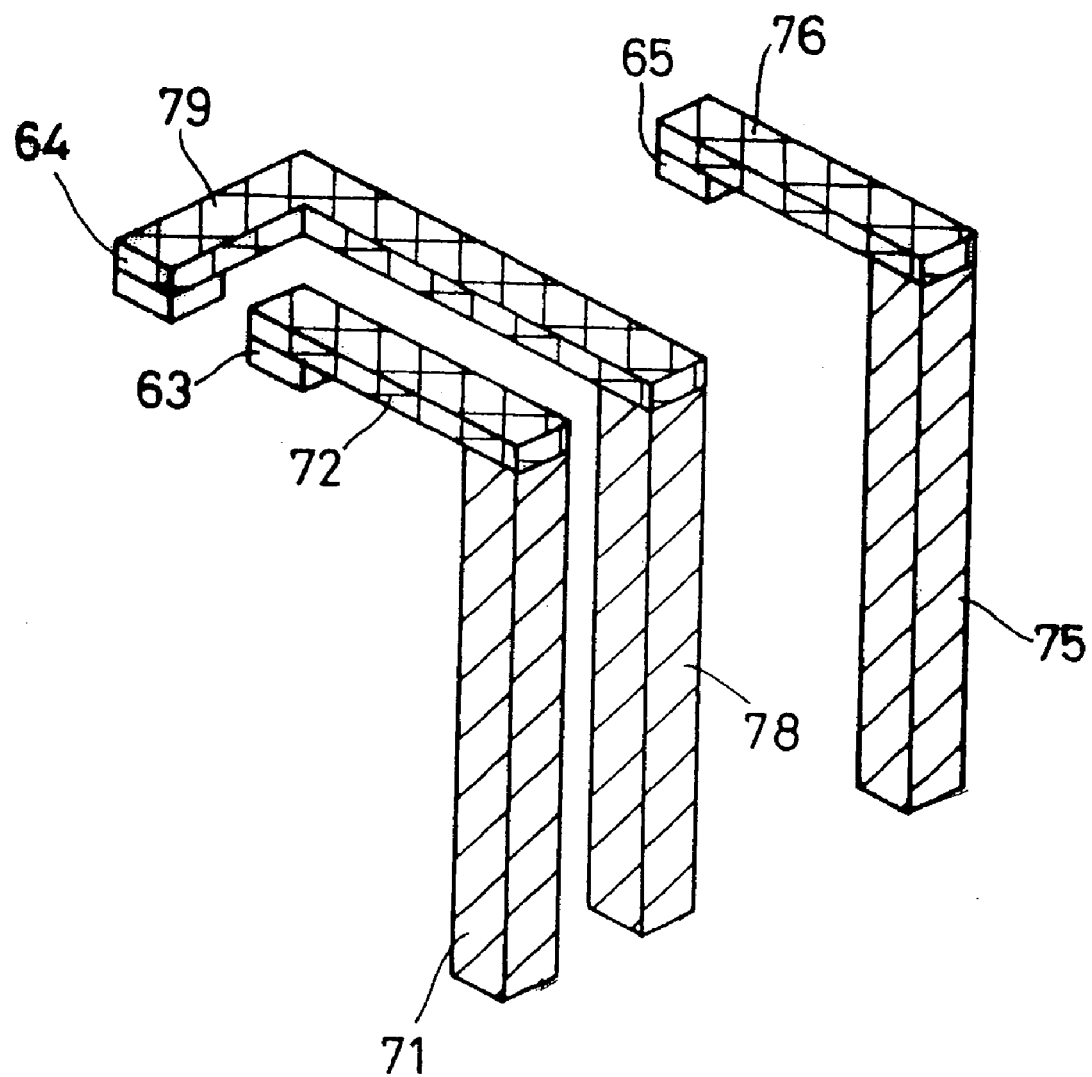
FIG. 18 is a perspective view showing the wiring patterns of the chip assemblies in the multilayered module 50 shown in FIG. 16.

FIG. 10 is a diagram showing the data-line selection means 170 which is disposed in the memory chip assembly. The memory chip assembly includes additional data lines 172 which are formed in addition to the data lines of the memory chip and which are larger in number than the data lines, and the data-line selection means 170 for selecting the additional data lines 172 and connecting them to the data lines 171 of the memory chip.

The data lines are input/output terminals, for which whether they are operating as outputs or as inputs can be specified in accordance with an OE (output enable) terminal and states such as RW (read/write designation). Therefore, data selectors for the inputs and data selectors for the outputs may be independently disposed, or when bi-directional data selectors are employed, even the input/output terminals can be incarnated by illustrated connections.

The memory chip assembly is formed with the additional data lines 172 which are larger in number than the data lines of the memory chip. The data-line selection means 170 includes a plurality of data selectors 173. Identification data are input from the storage means 85 to the respective data selectors 173. Each of the data selectors 173 is connected to the plurality of additional data lines 172, and one data line 171 of the memory chip. Any of the additional data lines 172 can be selected on the basis of the identification data so as to be connected to the data line 171 of the memory chip.

In this manner, the additional data lines 172 can be selected by the identification data. By way of example, therefore, a memory module in which four memory chips each corresponding to an 8-bit bus are stacked can be used as a memory corresponding to a 32-bit bus. That is, inputs from the 32-bit bus can be selected by the identification data and distributed to the four stacked memory chips. Accordingly, a memory module of large capacity can be easily configured with a small space by stacking a plurality of memory chips.

Further, in still another embodiment of the invention, address lines and data lines may be added to a memory chip assembly so as to configure the memory-chip selection means 160 shown in FIG. 9 and the data-line selection means 170 shown in FIG. 10, in combination.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

INDUSTRIAL APPLICABILITY

As described above, according to the present invention, data to be output from a data derivation section can be made different between in a case where fixed data held in fixed-data holding means and identification data stored in storage means agree and in a case where they disagree.

A boundary scan test is performed for a daisy chain in which a plurality of boundary scan controllers are connected. With the boundary scan controllers of the invention, the identification data of a semiconductor circuit chip at the uppermost stage is held as the fixed data in the fixed-data holding means, whereby the data to be output from the data derivation section, in only the boundary scan controller at the uppermost stage, can be made different from the data to be output from the other data derivation sections.

Accordingly, the output section of the boundary scan controllers disposed in the semiconductor circuit chip of the uppermost stage is brought into a non-connected state, whereby the data derivation sections of the individual boundary scan controllers can be connected to an identical bus line. That is, among the data derivation sections which are connected to the identical bus line, the data derivation sections of the boundary scan controllers disposed in semiconductor circuit chips except at the uppermost stage can be brought into a disconnected state from the bus line. Thus, a semiconductor apparatus can be configured by stacking the same semiconductor circuit chip assemblies each of which includes the boundary scan controller.

Besides, according to the invention, in a case where identification data is stored in storage means and where comparison information indicates the agreement between the identification data and fixed data, a data derivation section outputs the same data as test result data which is outputted from an output section. Accordingly, the detailed test result data can be obtained from the data derivation section, and a detailed place of defective connection can be specified.

Besides, according to the invention, in a case where identification data is not stored in storage means, a data derivation section maintains its output at a predetermined signal level. The "predetermined signal level" signifies, for example, the state of H level. Thus, even when the output side of the data derivation section is connected to a circuit, the data derivation section can be brought, in effect, into a disconnected state from the circuit.

Besides, according to the invention, semiconductor circuit chip assemblies can be formed by an identical wafer process, so that a labor for forming the semiconductor circuit chip assemblies can be relieved. Moreover, in the case of forming a semiconductor apparatus, the same semiconductor circuit chip assemblies are stacked, so that a stacking order, etc. need not be considered, the formation of the apparatus is facilitated, and the manufacturing cost is lowered.

Besides, according to the invention, even when a selection signal for selecting a memory chip has been input, the operation of the memory chip is not permitted by permission means unless data corresponding to additional address lines agrees with identification data stored in storage means. Accordingly, even when the same selection signals have been input, the permission means can permit only the operation of one memory chip, and hence, each of stacked memory chips can be operated.

Besides, according to the invention, selection means selects additional data lines in accordance with identification data stored in storage means and connects the selected additional data lines to the data lines of a memory chip, so that the additional data lines can be allocated to each of stacked memory chips. Accordingly, each memory chip can be operated by connecting to bus lines which are larger in number than bus lines corresponding to one memory chip. Thus, a large-capacity memory module can be configured by stacking memory chip assemblies, without increasing the sorts of the memory chips.

Besides, according to the invention, respective semiconductor circuit chips can be individually recognized by identification data stored in storage means. Accordingly, the semiconductor circuit chips can be individually managed by employing the identification data.

Besides, according to the invention, a semiconductor circuit chip which is selected on the basis of identification data stored in storage means is operated, so that stacked semiconductor circuit chips can be individually operated.

The invention claimed is:

1. A semiconductor apparatus comprising:
    a stack of semiconductor circuit chip assemblies of a same sort which are each configured by disposing a boundary scan controller in a semiconductor circuit chip,
    wherein the boundary scan controller is configured to control a shift register circuit that include boundary scan cells respectively disposed between external signal input terminals and input terminals of an internal logic circuit and between external signal output terminals and output terminals of the internal logic circuit which are connected in series, the boundary scan controller comprising:
    a clock input part configured to provide input/output timings;
    a test mode input part configured to provide a predetermined operation instruction;
    a data input part configured to input identification data and test data of the semiconductor circuit chip;
    a storage section configured to store the identification data therein;
    a controller configured to execute the predetermined operation instruction so as to store the identification data in the storage section and configured to perform a circuit test with the test data so as to obtain test result data;
    a data output section configured to output the test result data obtained by the controller, the data output section always carrying out the output;
    a fixed-data holding section configured to hold predetermined fixed data therein;
    a comparator configured to make a comparison as to whether or not the identification data and the fixed data are in agreement, and output comparison result information; and
    a data derivation section coupled to the data output section to receive the test result data that is outputted from the data output section, the data derivation section being configured to derive data corresponding to the test result data on the basis of the comparison result information.

2. The semiconductor apparatus of claim 1, wherein the identification data is stored in the storage section at an uppermost stage and the comparison result information indicates agreement between the identification data and the fixed data, the data derivation section outputting the same data as the test result data outputted from the data output section.

3. The semiconductor apparatus of claim 1 or 2, wherein the identification data is not stored in the storage section at a stage other than the uppermost stage and the data derivation section is configured to output data indicating that the identification data is not stored in the storage section.

4. The semiconductor apparatus of claim 1 or 2, wherein the identification data is not stored in the storage section at a stage other than the uppermost stage and the data derivation section is configured to maintain its output at a predetermined signal level.

5. The semiconductor apparatus of claim 1 or 2, wherein the identification data is stored in the storage section at a stage other than the uppermost stage and the comparison result information outputted from the comparator indicates disagreement between the identification data and the fixed data, the data derivation section being configured to maintain its output at a predetermined signal level.

6. The semiconductor apparatus of claim 2, wherein the semiconductor circuit chip includes a memory chip and at least one of the semiconductor circuit chip assemblies comprises:
    additional address lines formed in addition to address lines of the memory chip;
    a selection signal line configured to input a selection signal for selecting the memory chip; and
    a permission section configured to permit an operation of the memory chip where data corresponding to the additional address lines of the memory chip and the identification data stored in the storage means are in agreement, and where the selection signal is input.

7. The semiconductor apparatus of claim 6, wherein the semiconductor circuit chip includes a memory chip and at least one of the semiconductor circuit chip assemblies comprises:
    additional data lines formed in addition to data lines of the memory chip, the additional data lines being larger in number than the data lines; and
    a selector configured to select the additional data lines and connect them to the data lines of the memory chip in accordance with the identification data.

8. A semiconductor-circuit-chip identification method for identification of semiconductor circuit chips in the semiconductor apparatus of claim 6, comprising:
    identifying the respective semiconductor circuit chips by the identification data.

9. A semiconductor-circuit-chip control method for controlling the semiconductor circuit chips in the semiconductor apparatus of claim 6, comprising:
    allowing a semiconductor circuit chip which has been selected on the basis of the identification data to carry out its operation.

* * * * *